(12) United States Patent
Haldar et al.

(10) Patent No.: US 9,755,652 B2
(45) Date of Patent: Sep. 5, 2017

(54) NANOMAGNETIC NETWORK STRUCTURES AND A METHOD OF RECONFIGURABLE OPERATION BASED ON MAGNETIZATION DYNAMICS

(71) Applicant: National University of Singapore, Singapore (SG)

(72) Inventors: Arabinda Haldar, Singapore (SG); Adekunle Adeyeye, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 15/196,879

(22) Filed: Jun. 29, 2016

(65) Prior Publication Data

US 2017/0005663 A1    Jan. 5, 2017

Related U.S. Application Data

(60) Provisional application No. 62/188,490, filed on Jul. 3, 2015.

(51) Int. Cl.
| | |
|---|---|
| *H03K 19/20* | (2006.01) |
| *H03K 19/21* | (2006.01) |
| *H01L 43/08* | (2006.01) |
| *H03K 19/168* | (2006.01) |
| *H01L 43/10* | (2006.01) |
| *B82Y 10/00* | (2011.01) |
| *B82Y 25/00* | (2011.01) |

(52) U.S. Cl.
CPC ............ *H03K 19/21* (2013.01); *H01L 43/08* (2013.01); *H01L 43/10* (2013.01); *H03K 19/168* (2013.01); *B82Y 10/00* (2013.01); *B82Y 25/00* (2013.01); *Y10S 977/94* (2013.01); *Y10S 977/943* (2013.01)

(58) Field of Classification Search
None
See application file for complete search history.

(56) References Cited

U.S. PATENT DOCUMENTS

| 8,138,874 B1* | 3/2012 | Carlton | B82Y 25/00 |
|---|---|---|---|
| | | | 29/607 |
| 2011/0274928 A1* | 11/2011 | Liu | B82Y 25/00 |
| | | | 428/402 |

OTHER PUBLICATIONS

Aharoni, A., "Demagnetizing factors for rectangular ferromagnetic prisms," Journal of Applied Physics 1998, 83 (6), 3432-3434.

* cited by examiner

*Primary Examiner* — Anh Tran
(74) *Attorney, Agent, or Firm* — Michael Best & Friedrich LLP

(57) ABSTRACT

A nanomagnetic structure and a method of fabricating a nanomagnetic structure. The nanomagnetic comprises two or more nanomagnetic material elements, each nanomagnetic material element having a respective predetermined geometric shape such that the nanomagnetic structure exhibits different stable ground states initializable by magnetic fields applied across the nanomagnetic structure in respective different directions; wherein the nanomagnetic material elements are disposed relative to each other such that the magnetic structure exhibits a difference in effective internal magnetic field strength between the different stable ground states. Advantageously, this variation in the internal magnetic field strength is the key for distinct dynamic response associated with the different magnetic ground states. Reconfigurable operation has been shown based on this magnetization dynamics in example embodiments.

22 Claims, 17 Drawing Sheets

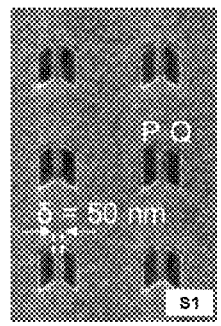
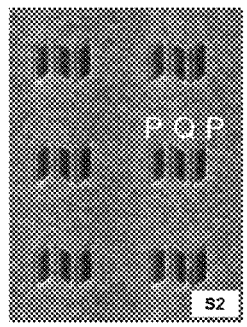
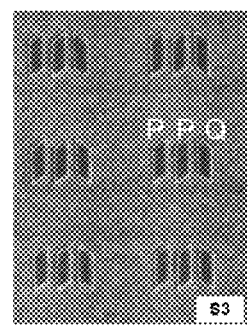
FIG. 4B　　　　　　　FIG. 4C　　　　　　　FIG. 4D
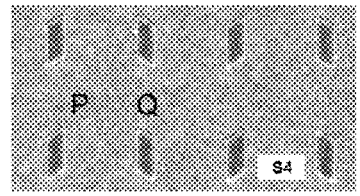
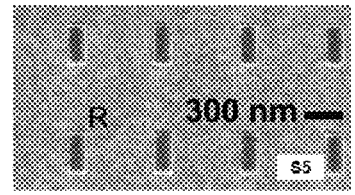
FIG. 4E　　　　　　　FIG. 4F
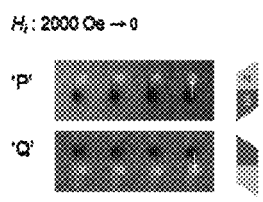
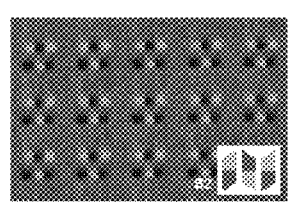
FIG. 5A　　　　　　　FIG. 5B　　　　　　　FIG. 5C
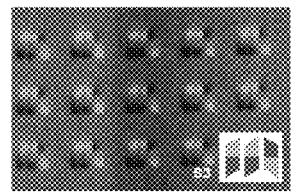
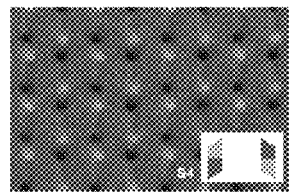
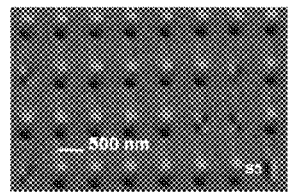
FIG. 5D　　　　　　　FIG. 5E　　　　　　　FIG. 5F

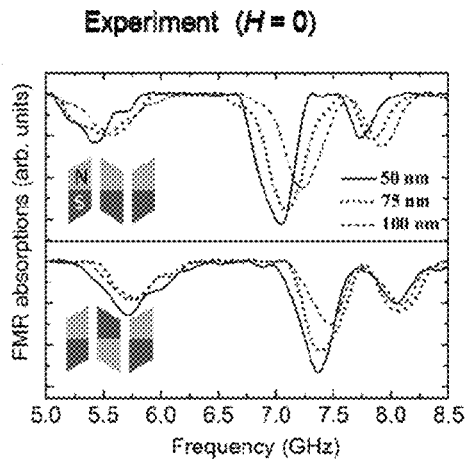
FIG. 8A
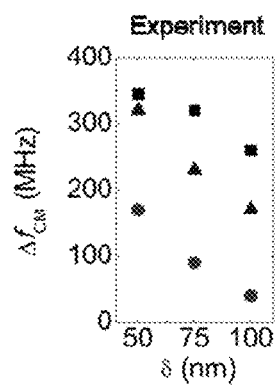
FIG. 8C
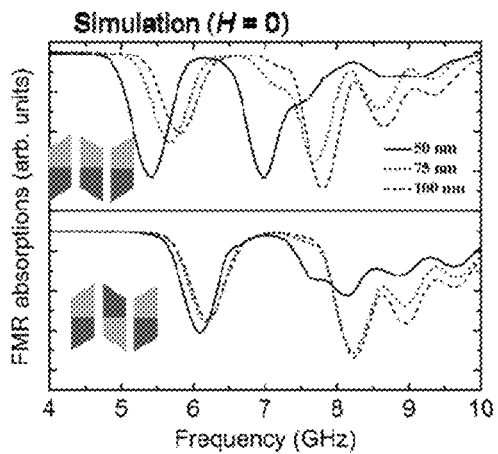
FIG. 8B
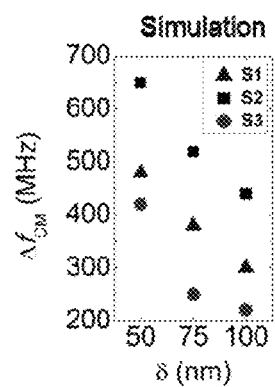
FIG. 8D
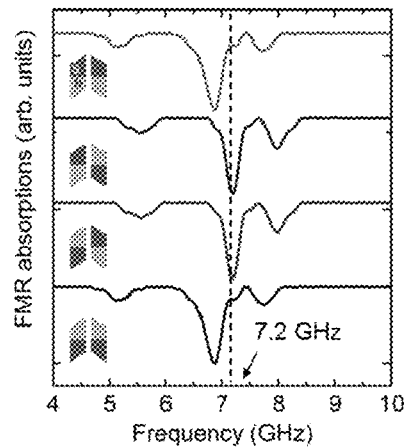
FIG. 9A
| Input magnet logic state | | Output (Absorption at 7.2 GHz) |
|---|---|---|
| P | Q | |
| 0 | 0 | 0 |
| 0 | 1 | 1 |
| 1 | 0 | 1 |
| 1 | 1 | 0 |
FIG. 9B

| Sample (u×w×δ in nm³) | Switching field: amplitude/pulse width (Oe/ns) | |
|---|---|---|
| | FM to AFM | AFM to FM |
| S1 (300×130×50) | 500/0.8 | 790/0.7 |
| S2 (300×130×50) | 470/0.8 | 860/0.8 |
| S3 (300×130×50) | 540/0.7 | 840/0.8 |
| S1 (80×50×20) | 590/0.4 | 1030/0.4 |
| S2 (80×50×20) | 580/0.4 | 1150/0.6 |
| S3 (80×50×20) | 620/0.4 | 1050/0.4 |

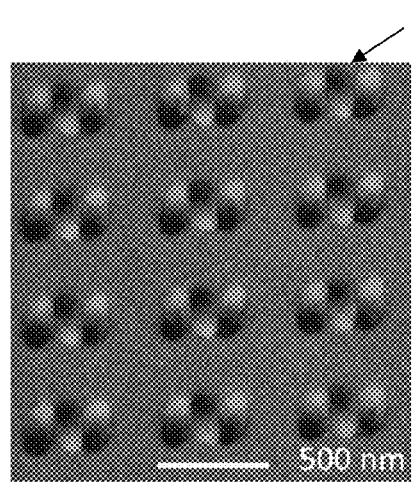
FIG. 11F
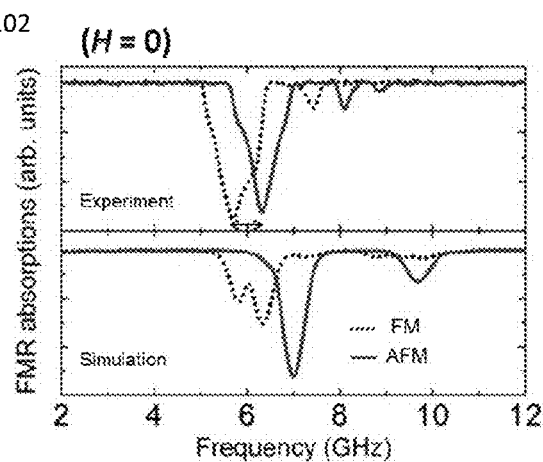
FIG. 11G
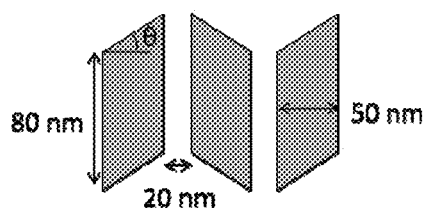
FIG. 12A
| θ (deg) | Frequency shift (MHz) |
|---|---|
| 10 | 980 |
| 20 | 1720 |
| 30 | 1120 |
| 40 | 1260 |
| 50 | 1320 |
FIG. 12B
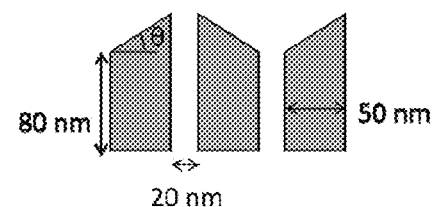
FIG. 12C
| θ (deg) | Frequency shift (MHz) |
|---|---|
| 10 | -- |
| 20 | 880 |
| 30 | 960 |
| 40 | 990 |
| 50 | 870 |
FIG. 12D

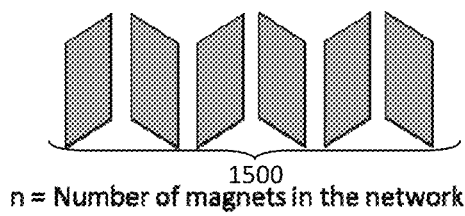
u = 300 nm, w = 130 nm, θ = 32°, δ = 50 nm
1500
n = Number of magnets in the network
FIG. 15A
| No. of magnets (n) | Frequency shift (MHz) |
|---|---|
| 2 | 480 |
| 3 | 650 |
| 10 | 1310 |
| 20 | 1360 |
FIG. 15C
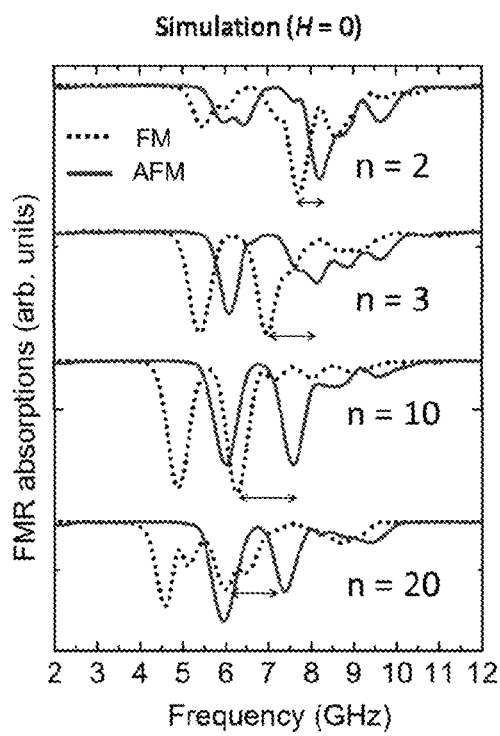
FIG. 15B
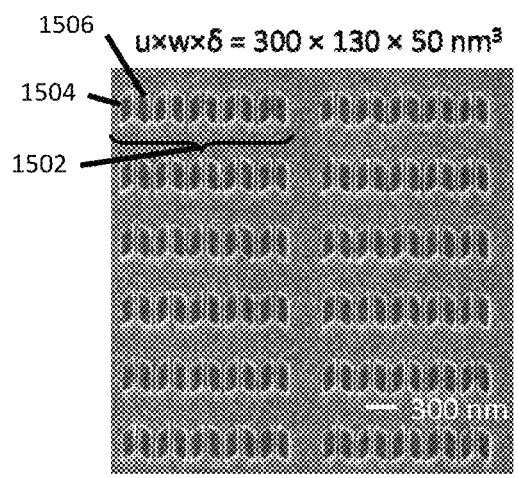
FIG. 15D
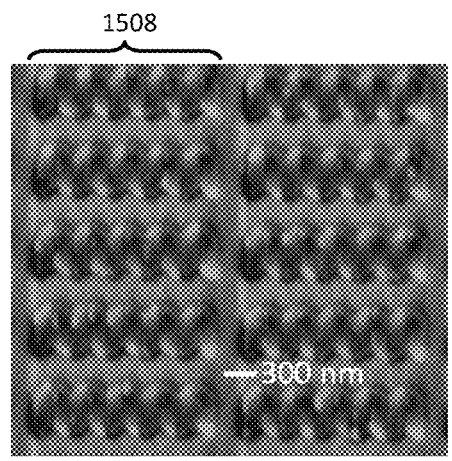
FIG. 15E

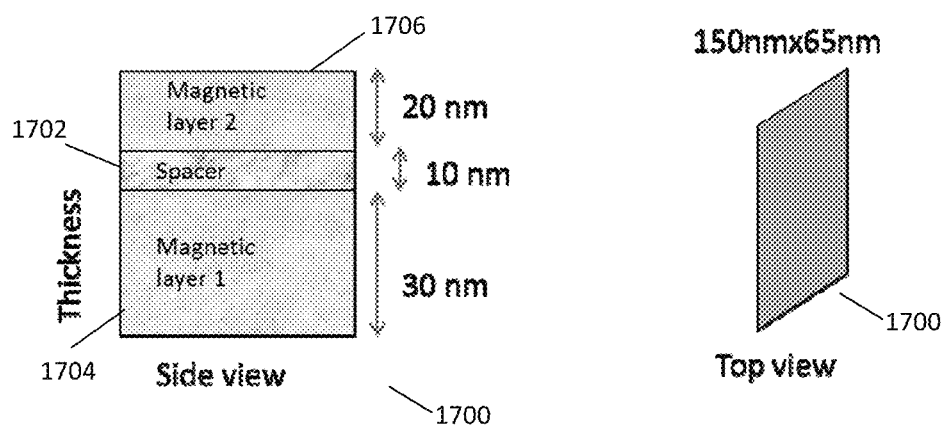
FIG. 17A
FIG. 17B
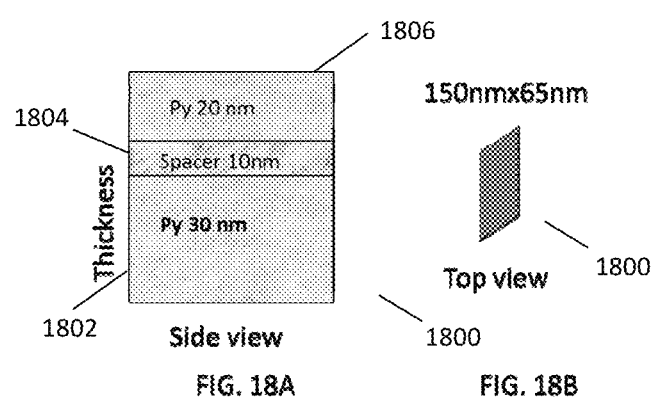
FIG. 18A
FIG. 18B
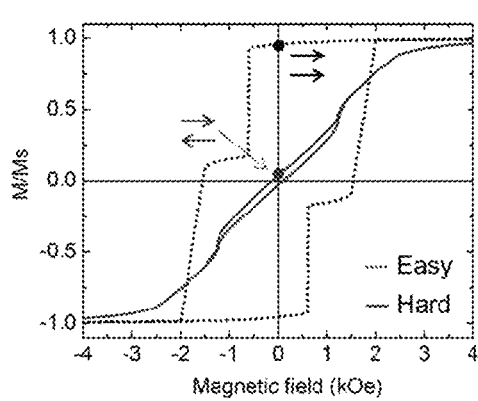
FIG. 18C
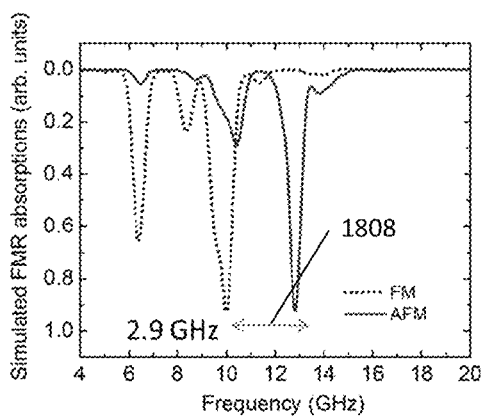
FIG. 18D

NANOMAGNETIC NETWORK STRUCTURES AND A METHOD OF RECONFIGURABLE OPERATION BASED ON MAGNETIZATION DYNAMICS This application claims priority to U.S. Provisional Application No. 62/188,490 filed Jul. 3, 2015, entitled Deterministic Control Of Magnetization Dynamics In Reconfigurable Nanomagnetic Networks. Said application is expressly incorporated herein by reference in its entirety.

FIELD OF THE INVENTION

This invention relates broadly to nanomagnetic network structures and a method of reconfigurable operation/functionality based on magnetization dynamics, and more particularly to deterministic control of magnetization dynamics in reconfigurable nanomagnetic networks.

BACKGROUND OF THE INVENTION

Nanomagnet based memory and logic operations are of great technological interest due to their non-volatility, ultra-high density, unlimited endurance and thermal robustness. Nanomagnets are the key elements of any spintronic devices and they are a potential alternative to current semiconductor technology which has reached its limits in terms of integration density and low power operation.

In this context, recent attempts are noted for the rapid commercialization of magnetic random access memory (MRAM) which is known as universal memory. Nanomagnet based devices rely on manipulating the magnetic ground state. Nanomagnetic logic has been realized using magnetic quantum-dot cellular automata (MQCA) approach and the operation of majority logic gate has been demonstrated in such systems. In such systems binary information is stored into bistable units and the information is processed through dipolar-coupled chains leading to ferromagnetic (FM) and/or antiferromagnetic (AFM) ordering for appropriately structured arrays.

Dipolar coupling driven AFM ground state requires a carefully adjusted field initialization process and it is susceptible to imperfection due to fabrication limitations. To date most of the studies on such coupled chains are explored by studying their magnetic ground states using magnetic force microscopy (MFM) and tuned for different logic operations, however, functionality of such architecture based on their collective dynamic behaviour has not been explored or achieved. These prior attempts have resulted in various problems, such as for example, susceptible operation due to fabrication defects, low reliability in large area arrays of nanomagnets with non-uniform magnetic states and switching, susceptible operation due to magnetostatic interactions in closely spaced devices, bias field to hold a particular magnetic state, and/or complexity in clocking field application for reliable operation in dipolar coupling driven devices.

The example embodiments described herein seek to address or at least alleviate the above problems.

SUMMARY OF THE INVENTION

In accordance with a first aspect of the present invention there is provided a nanomagnetic structure comprising two or more nanomagnetic material elements, each nanomagnetic material element having a respective predetermined geometric shape such that the nanomagnetic structure exhibits its different stable ground states initializable by magnetic fields applied across the nanomagnetic structure in respective different directions; wherein the nanomagnetic material elements are disposed relative to each other such that the magnetic structure exhibits a difference in effective internal magnetic field strength between the different stable ground states.

In accordance with a second aspect of the present invention there is provided a method of reconfigurable operation based on magnetization dynamic responses of a nanomagnetic structure or network for realizing a functionality of the nanomagnetic structure or network, the method comprising determining distinct dynamic spectra associated with different magnetic ground states due to an engineered internal magnetic field strength variation specific to the nanomagnetic structure or network.

In accordance with a third aspect of the present invention there is provided a method of fabricating a nanomagnetic structure, the method comprising providing two or more nanomagnetic material elements, each nanomagnetic material element having a respective predetermined geometric shape such that the nanomagnetic structure exhibits different stable ground states initializable by magnetic fields applied across the nanomagnetic structure in respective different directions; and disposing the nanomagnetic material elements relative to each other such that the magnetic structure exhibits a difference in effective internal magnetic field strength between the different stable ground states.

BRIEF DESCRIPTION OF THE DRAWINGS

The accompanying drawings incorporated herein and forming a part of the specification illustrate several aspects of the present invention and, together with the description, serve to explain the principles of the invention. While the invention will be described in connection with certain embodiments, there is no intent to limit the invention to those embodiments described. On the contrary, the intent is to cover all alternatives, modifications and equivalents as included within the scope of the invention as defined by the appended claims. In the drawings:

FIG. 4B-4F show comparative scanning electron micrographs of samples S1-S5, respectively, in accordance with embodiments of the invention;

FIG. 5A shows comparative experimental MFM contrasts at remanence for P-magnet and Q-magnet after initialization with $H_f$: 2000 Oe→0 along + x-axis, and observed magnetization directions are shown as North pole and South pole in accordance with embodiments of the invention;

FIG. 5B-5F show comparative experimental MFM contrasts at remanence for samples S1-S5 after initialization with $H_f$: 2000 Oe→0 along + x-axis, and observed magnetization directions are shown as North pole and South pole in accordance with embodiments of the invention;

FIG. 8A shows variation of experimental FMR absorption spectra for design S2 with varying the gap, δ, in FM and AFM ground states in accordance with embodiments of the invention;

FIG. 8B shows the simulation results corresponding to FIG. 8A in accordance with embodiments of the invention;

FIG. 8C shows the variation of $\Delta f_{CM} = f_{CM}(AFM) - f_{CM}(FM)$ with the gap, δ, for designs S1-S3 in accordance with embodiments of the invention;

FIG. 8D shows the simulation results corresponding to FIG. 8C in accordance with embodiments of the invention;

FIG. 9A shows the experimental absorption spectra in sample S1 (δ=50 nm) at different ground states of the input magnets P and Q for demonstration of XOR logic operation in accordance with an embodiment of the invention;

FIG. 9B shows a truth table for XOR gate where absorption at 7.2 GHz is used as an output in accordance with an embodiment of the invention;

FIG. 11F shows the experimental magnetic force microscopy (MFM) image at AFM ground state for the sample shown in FIG. 11E in accordance with an embodiment of the invention;

FIG. 11G shows the experimental ferromagnetic resonance (FMR) absorption spectra (top panel) at for FM and AFM ground state and the shift between the resonant modes, and the results are also compared with simulations (bottom panel) in accordance with an embodiment of the invention;

FIG. 12A shows a schematic drawing illustrating the angle (θ) of the slanted edges of designs S2 with dimensions u×w×δ=80×50×20 nm$^3$ in accordance with embodiments of the invention;

FIG. 12B shows a table of the frequency shifts for various angles, θ associated with the sample in FIG. 12A in accordance with embodiments of the invention;

FIG. 12C shows a schematic drawing illustrating a sample with the nanomagnets which have only one side slanted, and the angle of the slanted edge is shown having the dimensions of u×w×δ=80×50×20 nm$^3$ in accordance with embodiments of the invention;

FIG. 12D shows a table of the frequency shifts for various angles, θ associated with the design in FIG. 12C in accordance with embodiments of the invention;

FIG. 15A shows a schematic drawings illustrating a network of varying number of nanomagnets (n=6 here) with $u \times w \times \delta = 300 \times 130 \times 50$ nm$^3$ in accordance with embodiments of the invention;

FIG. 15B shows simulated FMR absorption spectra by varying the number of magnets (n) in the network at FM and AFM ground magnetic configurations in accordance with embodiments of the invention;

FIG. 15C shows a table of the frequency shift with varying number of magnets (n) in the network in accordance with embodiments of the invention;

FIG. 15D shows an SEM image of a network with 10 nanomagnets with alternate P and Q magnets in accordance with an embodiment of the invention;

FIG. 15E shows the experimental MFM image of the sample in FIG. 15D in AFM magnetic ground state in accordance with an embodiment of the invention;

FIG. 17A shows a schematic drawing illustrating a multilayer rhomboid nanomagnet in accordance with embodiments of the invention;

FIG. 17B shows a schematic top plan view of the multilayer rhomboid nanomagnet of FIG. 17A in accordance with embodiments of the invention;

FIG. 18A shows a schematic drawing illustrating a multilayer rhomboid nanomagnet with Permalloy (Py)/Permalloy (Py) multilayers physically separated by a spacer layer in accordance with an embodiment of the invention;

FIG. 18B shows a schematic top plan view of the multilayer rhomboid nanomagnet of FIG. 18 in accordance with an embodiment of the invention;

FIG. 18C shows the hysteresis loops along easy and hard directions of the multilayer rhomboid nanomagnet of FIG. 18 in accordance with an embodiment of the invention;

FIG. 18D shows the FMR spectra graph for FM and AFM configurations of the multilayer rhomboid nanomagnet of FIG. 18 in accordance with an embodiment of the invention;

DETAILED DESCRIPTION

Figure 1A:
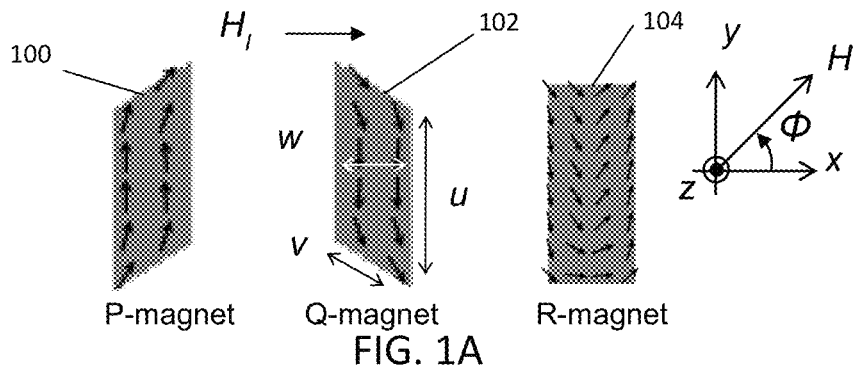
FIG. 1A demonstrates a comparison of P-, Q- and R-type nanomagnets for an initialization field, $H_I$: 2000 Oe→0 along x-axis in accordance with embodiments of the invention.

The example embodiments described herein seek to advantageously provide reliable generation/manipulation of multiple ground magnetic states, and use of the magnetization dynamic properties in coupled nanomagnetic chains for reconfigurable nanomagnetic networks. In example embodiments, additional functionality of the dynamic behaviour based on a collective dynamic response is demonstrated and the concept is explored utilizing networks of bistable rhomboid nanomagnets. The control of the magnetization ground states of the networks is achieved in the example embodiments by the geometrical design of the nanomagnets instead of the conventional inter-element dipolar coupling. Collective dynamic responses of both the ferromagnetic and anti-ferromagnetic ground states are monitored using broadband ferromagnetic resonance spectroscopy technique and direct imaging using magnetic force microscopy. Micromagnetic simulations and numerical calculations are used to validate the experimental observations from example embodiments. The described embodiments may have unique applications in magnetic information processing based on dynamic behaviors in addition to ground state configurations of dipolar-coupled nanomagnetic networks.

In example embodiments of the invention, control of magnetization dynamics is demonstrated in bistable nanomagnetic networks and operations based on magnetization dynamics. Distinct dynamic responses are obtained from reconfigurable FM and AFM ground states of the networks. Instead of magnetic coupling induced anisotropy, shape induced magnetic anisotropy is utilized from, for example, rhomboid shaped nanomagnets (RNM) to advantageously achieve deterministic magnetic ground states. RNM stabilizes into a unique magnetic ground state (up ↑ or ↓) in example embodiments after field initialized along its geometrical short axis irrespective of its coupled neighbors in the network. This can provide a great advantage over dipolar coupling mediated architectures which are less reliable in large array configuration and sensitive to fabrication defects.

It is noted that the nanomagnets may take other geometric shapes or alignments in addition to rhomboid to achieve shape induced magnetic anisotropy, for example, parallelogram, trapezoid, kite, quadrilateral, or the like, and the rhomboid shaped nanomagnets (RNM) are discussed in detail in example embodiments described herein by way of example, not limitation.

In exemplary embodiments, several devices are fabricated on a single chip. The devices include arrays of networks of two and three RNMs on top of microwave excitation lines to monitor their dynamics using all-electrical broadband ferromagnetic resonance spectroscopy. FM/AFM magnetic ground states are directly imaged using magnetic force microscopy. Three different devices are fabricated with the following AFM ground state configurations of the respective network: ↑↓, ↑↓↑ and ↑↑↓. Distinct dynamic responses are obtained in two different ground magnetic states in all the coupled networks. This is attributed to the variation of the internal field in different ground states of the dipolar-coupled networks. Thus, the dynamic properties are manipulated by selectively placing the RNMs in different networks. This mechanism does advantageously not suffer from uncontrollable fabrication defects and uniform results are observed in arrays of more than 3000 networks in example embodiments.

Operation of XOR logic gate is demonstrated in example embodiments based on their ferromagnetic absorption spectra. For this purpose, devices with two dipolar-coupled RNMs are used in example embodiments. The magnetic ground states are utilized as inputs and absorption at a certain frequency is utilized as an output. Two nanomagnets have four different combinations of the magnetic orientations, two AFM and two FM configurations, and the AFM (↑↓ or ↓↑) orientation has a different response than the FM (↑↑ or ↓↓) orientation, thereby operating as XOR logic in example embodiments. A further improved operation of such devices is obtained in various embodiments by down scaling the dimensions and increasing the number of nanomagnets in a network. In this respect, a wide range of operations of example embodiments is found from simulations and experiment. Devices with reduced dimensions in example embodiments result in further pronounced and distinct dynamic behavior between FM/AFM states. On the other hand, more distinct dynamic responses are achieved by increasing the number of nanomagnets from two to twenty, for example.

Ultrafast (sub-ns) switching of the different ground states for example embodiments are estimated using micromagnetic simulations. Dynamic simulations are carried out to estimate the effect of angle of the slanted edge of a RNM and distinct dynamics are obtained with deterministic switching between FM-AFM states for 10-50° range. Correct operation and tunability of dynamics for magnets with one slanted edge in example embodiments are also demonstrated using simulations. Thickness dependent analysis is carried out on a single rhomboid nanomagnets embodiments and expected ground states are found at thicknesses >about 50 nm.

The deterministic control over magnetic ground states and probing magnetization dynamics as an output in example embodiments advantageously add extra functionalities in nanomagnetic network based spintronic devices. In example embodiments, the ground states of a RNM are not affected by its coupled neighbors, which is an important attribute also for biasing operations and as fixed layer in spin-valve devices. Example embodiments can also provide an advantage for obtaining a deterministic ground state in large area complex networks, which is elusive through dipolar-coupling induced magnetic anisotropy. This is of particular interest in microwave filter type applications based on magnonic crystals with reconfigurable magnetic states. Ultrafast tunabilities of ground magnetic state as well as its dynamics in RNM networks are appealing for programmable logic and storage with larger integration density and low power operation.

Dipolar-coupled rhomboid nanomagnet networks according to example embodiments described herewith have their magnetic ground states defined by shape anisotropy of the individual nanomagnets, and they advantageously do not depend on the nearest neighbors, which is in sharp contrast to a dipolar coupling driven architecture. In accordance with embodiments of the invention, deterministic control is achieved over forming different types of AFM states with high degree of reliability, and a large scale uniform AFM state is achievable which is of particular interest for reconfigurable magnetic states for logic applications or magnonic band gap engineering. High tolerance to fabrication defects may advantageously be achieved due to the robustness of the geometry. The dynamic behaviour of embodiments of the invention provides a functionality with distinct dynamics for different magnetic states which are reconfigurable, ultrafast (sub-ns) switching of various ground states, low power consumption since no bias field required during operation, and a wide range of operations down to sub-100 nm dimensions.

In embodiments of the invention both the FM and AFM ground states are stabilized over a very large area using bistable nanomagnetic networks made, by way of example, from rhomboid shaped nanomagnets (RNM). The control of magnetization dynamics in these structures is shown using ferromagnetic resonance (FMR) spectroscopy. Instead of magnetic coupling induced anisotropy, shape induced magnetic anisotropy is utilized in the example embodiments from the RNM to achieve deterministic magnetic ground states. RNM stabilizes into a unique magnetic ground state after initialized along its geometrical short axis irrespective of its coupled neighbors in the network. Networks of two and three RNM networks are lithographically defined in example embodiments and their magnetic ground states are directly imaged using magnetic force microscopy. By selectively placing the RNMs, unprecedented control of FM and AFM ground states of different types with distinct dynamics responses are obtained for the different networks in example embodiments. Micromagnetic simulations and numerical calculations are used to obtain insights in magnetization reversal mechanisms and magnetization dynamics of example embodiments.

Embodiments of the invention can have several advantages for spintronic applications. Thanks to its geometry, for example RNM based networks are suitable for obtaining arbitrary ground states over a very large area, which are elusive in dipolar-coupling driven architectures. Deterministic control of more complex magnetic ground states in two or three dimensional large area networks may be achieved in various embodiments using combinations of, for example, such RNM nanomagnets. The simple switching mechanism of the two ground magnetic states in example embodiments and the distinct dynamic responses are attractive for the development of magnetic logic gates and tunable RF/microwave devices which can advantageously be operated without the use of bias magnetic field. Example embodiment of the invention are also promising for ultrahigh density integration as the dimensions of the networks are smaller compared to logic operations based on coupled vortices, nanowires and domain-wall motion based devices. Coupled arrays of, for example, RNMs can also be exploited as magnonic crystals with reconfigurable magnetic ground states, which can advantageously add additional control over magnonic bands.

Figure 1B:
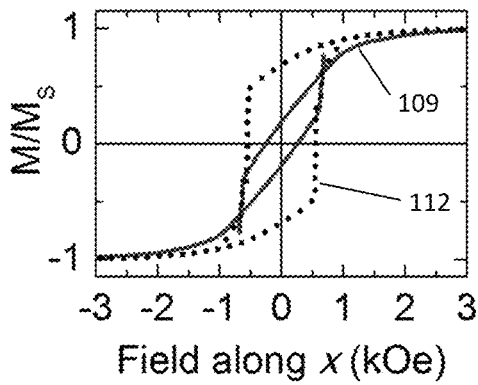
FIG. 1B shows a comparison of hysteresis loops for P and R magnets along the geometrical short axis in accordance with embodiments of the invention.
Figure 1C:
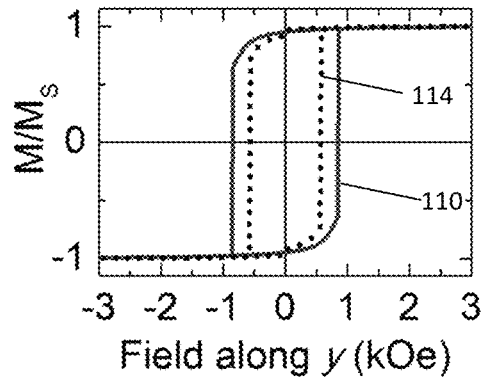
FIG. 1C shows a comparison of hysteresis loops for P and R magnets along the geometrical long axis in accordance with embodiments of the invention.
Figure 1D:
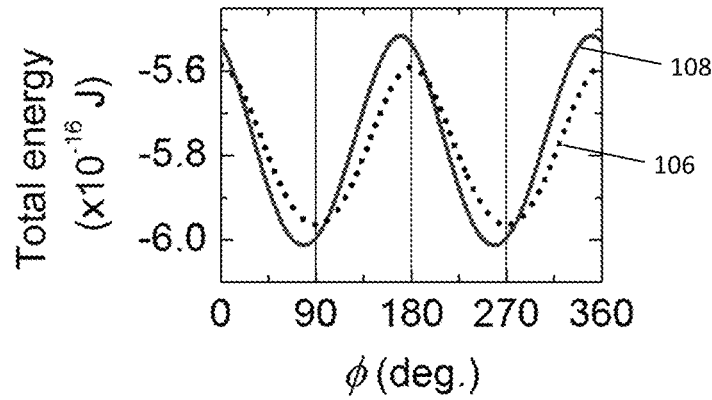
FIG. 1D depicts the energy landscape illustrating shift in energy minima and maxima in P magnets as compared to R magnets in accordance with embodiments of the invention.

In the following description of example embodiment, two types of RNMs are used to construct the different magnetic ground states with a high degree of reliability. It will be appreciated that nanomagnets of other geometries and/or materials may be used in different embodiments. FIG. 1A illustrates two RNMs 100, 102 which are called P- and Q-type RNM herein along with a rectangular nanomagnet 104 (R-type) for reference. Note that the Q-magnet 102 is a mirror image of the P-magnet 100. The dimensions of the RNMs 100, 102, 104 are set to 300 nm×130 nm×25 nm (u×w×t), where u, w are the sides of the RNMs 100, 102, 104 and t is the thickness. Angle of the slanted edge θ for the RNMs 100, 102 is 32°. Identical parameters u×w×t are used for the R magnet 104, with θ=0°. For the co-ordinate system x-, y- and z-axis are chosen to be along the short, long and out-of-plane (thickness) directions of the nanomagnet, respectively. In order to investigate the magnetization reversal mechanisms in example embodiments, micromagnetic simulations are performed using finite element based micromagnetic solver OOMMF, a public domain software. Simulated magnetization distributions in these stand-alone magnets are shown after initializing them with a field, $H_I$: 2000 Oe→0 along the geometrical short axis (i.e. x-axis). At remanence magnetization always points upward (↑) in the P-magnets 100 and downward (↓) in the Q-magnets 102. In comparison, a multi-domain magnetization with arbitrary net magnetization (↑ or ↓) is observed in R-magnets 104. FIG. 1D illustrates that unlike the R-magnets (curve 106), the energy maxima (hard) and minima (easy) of the RNMs (see curve 108 for the P magnet 100) do not lie along the geometrical short and long axis, respectively. A deviation (Δφ) of about 10° was found between the magnetic hard axis and geometrical short axis. As a consequence, a favorable magnetization direction at remanence occurs in the RNMs for field initialization along the geometrical short axis. The full magnetic hysteresis loops of P- and R-magnets are compared in FIGS. 1B and 1C for fields applied along the short and long axis, respectively. The RNMs (data for P-magnet shown in FIG. 1B) tend to orient into well-defined ground states at a field, $H_{app}$~±1000 Oe while reducing the field applied along the x-axis FIG. 1B. On the other hand a larger coercive field for the RNMs (data for P-magnet shown in FIG. 1C) is observed for field applied along the long axis FIG. 1C. It is noted that if the initialization field direction is reversed the amplitude of internal field variation does not change, and only the polarity of the magnetization is reversed.

Figure 2A:
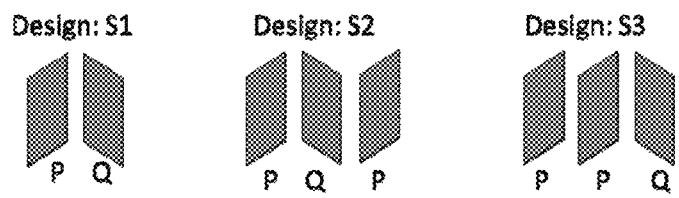
FIG. 2A shows schematic diagrams illustrating three types of networks (S1, S2 and S3), which are combinations of P and Q magnets, in accordance with embodiments of the invention.
Figure 2B:
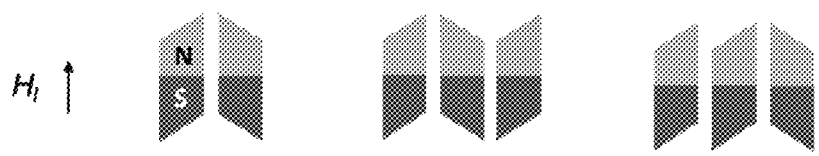
FIG. 2B shows schematic diagrams illustrating the magnetic configurations of S1, S2 and S3 for $H_I$ applied along the long axis in accordance with embodiments of the invention.
Figure 2C:
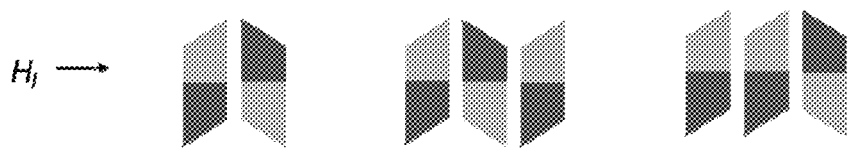
FIG. 2C shows schematic diagrams illustrating the magnetic configurations of S1, S2 and S3 for $H_I$ applied along the short axis in accordance with embodiments of the invention.

In order to manipulate the effective internal fields, different RNM configurations (S1, S2 and S3) are designed which are combinations of P and Q magnets, as shown in FIG. 2A in accordance with an embodiment of the invention. FIG. 2B illustrates the magnetic configurations of S1, S2 and S3 for $H_I$ applied along long axis, and FIG. 2C illustrates the magnetic configurations of S1, S2 and S3 for $H_I$ applied along short axis in accordance with embodiments of the invention.

Figure 3A:
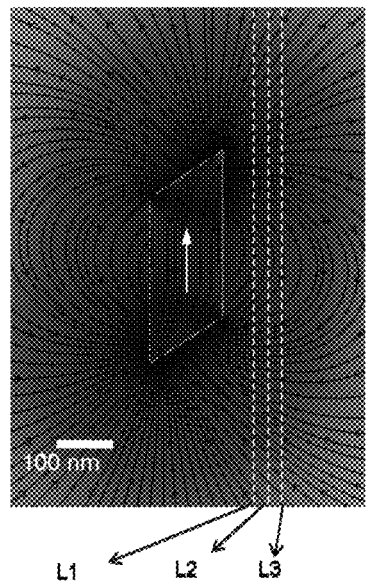
FIG. 3A represents simulated demagnetization field distributions at remanence due to a P nanomagnet in accordance with embodiments of the invention.
Figure 3B:
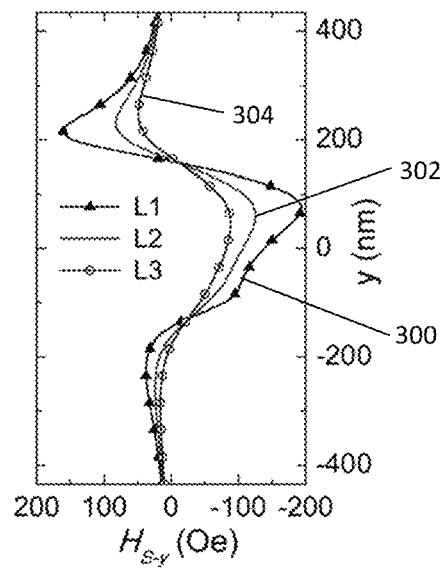
FIG. 3B shows the line scans of the y-component of the stray field ($H_{S-y}$) at a distance of 50 (L1), 75 (L2) and 100 nm (L3) from the right edge of the nanomagnet in accordance with embodiments of the invention.
Figures 3C, 3D, 3E:
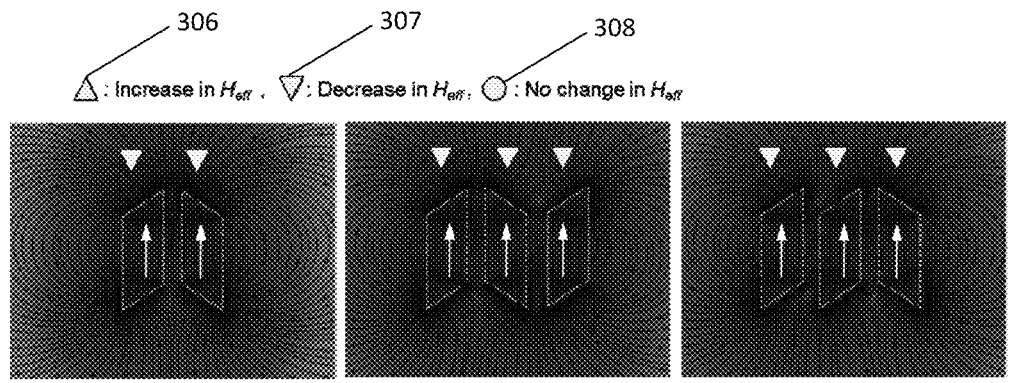
FIGS. 3C, 3D and 3E show the simulated demagnetization field distributions at ferromagnetic ground state for samples, S1, S2 and S3, respectively, in accordance with embodiments of the invention.
Figures 3F, 3G, 3H:
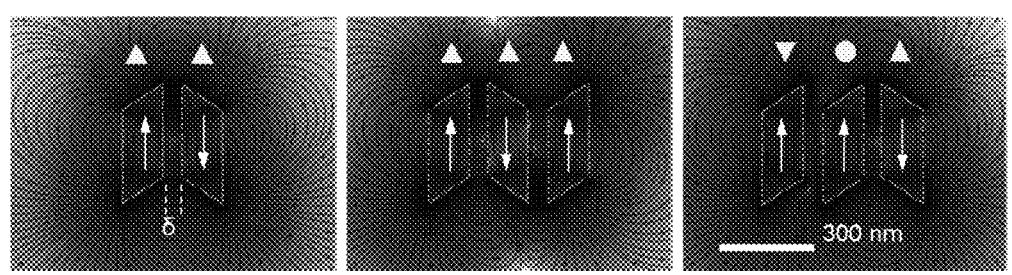
FIGS. 3F, 3G and 3H show the simulated demagnetization field distributions at antiferromagnetic ground state for samples, S1, S2 and S3, respectively, in accordance with embodiments of the invention.

FIG. 3A shows the stray fields ($H_S$) from a single P-type magnet. The regions of larger field strength are represented by darker contrasts. The y-component of the stray fields ($H_{S-y}$) at a distance of 50 nm (L1), 75 nm (L2) and 100 nm (L3) from the right edge of the P-magnet are shown in FIG. 3B. The maximum stray field ($H_{S-y}$) value at L3 is about 100 Oe, the direction of which depends on the magnetic orientation of the RNM. FIG. 3B shows the line scans of the y-component of the stray field ($H_{S-y}$) at a distance of 50 (L1), 75 (L2) and 100 nm (L3) from the right edge of the nanomagnet in accordance with an embodiment of the invention.

FIG. 3C-H shows the stray fields (HS) from the three different dipolar coupled RNMs networks PQ (S1), PQP (S2) and PPQ (S3). The gap (δ) between two neighboring nanomagnets is varied in the range from 50 nm to 100 nm to investigate the effect of dipolar coupling. For simplicity of the discussion following below, all the remanent magnetization states obtained with $H_I$ along the short axis are called as AFM state and are called FM state for $H_I$ along long axis. The FM ground states are obtained using $H_I$ (2000 Oe→0) applied along the long axis (i.e. y-axis), see FIG. 3C-E. On the other hand, $H_I$ (2000 Oe→0) applied along the short axis results down-up (↓↑), down-up-down (↓↑↓) and down-down-up (↓↓↑) magnetization orientations for PQ (S1), PQP (S2) and PPQ (S3) networks, see FIG. 3F-H respectively. It should be noted that a nanomagnet in a network experiences different stray field depending on the magnetic orientations of its coupled neighbors. This means that the effective field ($H_{eff}=H_{app}\pm H_{S-y}$; $H_{app}$ refers to applied magnetic field) inside a nanomagnet in the network will be different and this is indicated by markers 306-308 which essentially indicate the direction of $H_{S-y}$ as $H_{app}$=0. It can be seen that the internal field increases in the AFM cases (FIG. 3F-H) except for the PPQ (S3) network where the stray field effect is almost cancelled. On the other hand, the stray field direction is always in the opposite direction of magnetization in the FM ground states (FIG. 3C_E) leading to reduction of the internal fields. This concept is used to control the dynamic properties of the RNMs networks in example embodiments as will be discussed in detail later.

Figure 4A:
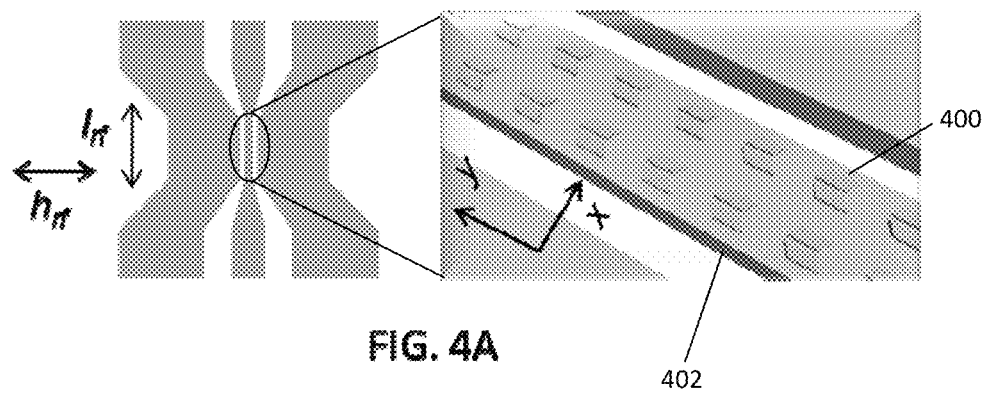
FIG. 4A shows a schematic diagram illustrating the experimental set-up showing the coplanar waveguides and the sample orientations on top of thereof, in accordance with embodiments of the invention.

In order to experimentally demonstrate the simulated results described above with reference to FIG. 3A-H, Permalloy ($Ni_{80}Fe_{20}$, hereinafter "Py") RNMs e.g. 400 with the above mentioned dimensions are patterned using electron beam lithography on top of predefined coplanar waveguides (CPWs) made from 200 nm thick, 20 μm wide Pt signal line e.g. 402 as shown in FIG. 4A. "$I_{rf}$" represents the RF current used for microwave excitation which is typically used for FMR experiment such as those as discussed for example embodiments below. The magnetic field generated due to this $I_{rf}$ is denoted by $h_{rf}$. Scanning electron microscopy (SEM) images of the coupled networks PQ, PQP and PPQ for δ=50 nm are shown in FIG. 4B-4D respectively. Note that the coupled networks may be patterned in other configurations, such as for example patterned for δ=75, 100 nm, and the like in different embodiments. Arrays of the networks are prepared to enhance the signal in ferromagnetic resonance (FMR) absorption experiment and the networks are de-coupled by setting a large (>1.5×u) distance between them. This implies that the FMR absorption will represent the response of a single network. In a real device, a single RNM network would be sufficient for operations with suitable detection techniques. For comparison, isolated arrays of PQ magnets (S4) and R magnets (S5) are fabricated with identical dimensions and the SEM images are also shown in FIGS. 4E and F respectively.

Figure 5G:
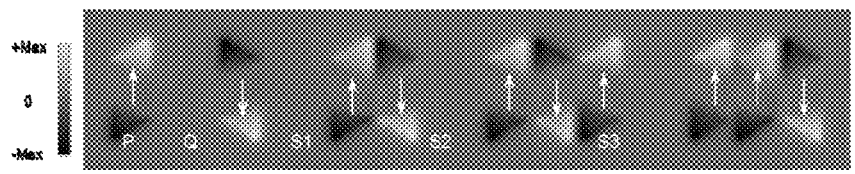
FIG. 5G represents comparative calculated MFM contrasts corresponding to the experimental MFM results, with bright and dark color contrasts represent the stray field in +z and −z directions, respectively, and white arrows show the directions of magnetizations obtained from micromagnetic simulations, in accordance with embodiments of the invention.

To investigate the ground states of the nanomagnets, magnetic force microscopy (MFM) imaging technique is used in the conventional lift mode using a commercial CoCr coated low moment tip at a constant height (40 nm). Prior to the MFM measurements shown in FIG. 5A-5F, the samples are initialized with $H_i$: 2000 Oe→0 along the short axis. FIG. 5A shows that the remanent magnetization direction in all the P-magnets points "up" and in all the Q-magnets points "down" for the same field initialization which is in good agreement with the simulation results shown in FIG. 1A. PQ (S1) networks show sharp alternate bright and dark MFM contrasts in each network. This implies all the PQ networks have anti-parallel magnetization; ↑↓ (see FIG. 5B). In PQP (S2) networks, up-down-up (↑↓↑) magnetization state can be observed (see FIG. 5C) whereas up-up-down (↑↑↓) magnetization state is obtained in PPQ (S3) networks (see FIG. 5D). It should be noted that similar MFM results are also obtained in the respective networks with patterned in other configurations, such as for example δ=75 nm, 100 nm, and the like. P and Q magnets have ↑ and ↓ magnetization, respectively in the isolated PQ array, as shown in FIG. 5E. Magnetic orientations are represented by North and South poles in the insets of FIG. 5B-5F. These observations confirm that the stray fields from the nearest neighbor do advantageously not alter the magnetic orientations of individual nanomagnets in a network and it is the shape anisotropy which defines the ground magnetic state instead. MFM image for the R nanomagnets shows the magnetizations mostly point upward with few nanomagnets in the multi-domain ground states, as shown in FIG. 5F. To compare the experimental MFM contrasts from the samples, stray field (z-component) is calculated at a constant height and the results are provided in FIG. 5G. These calculated results are in good agreement with the observed experimental MFM images, further validating the correct operations of the RNMs networks in the whole arrays in example embodiments.

Figure 6:
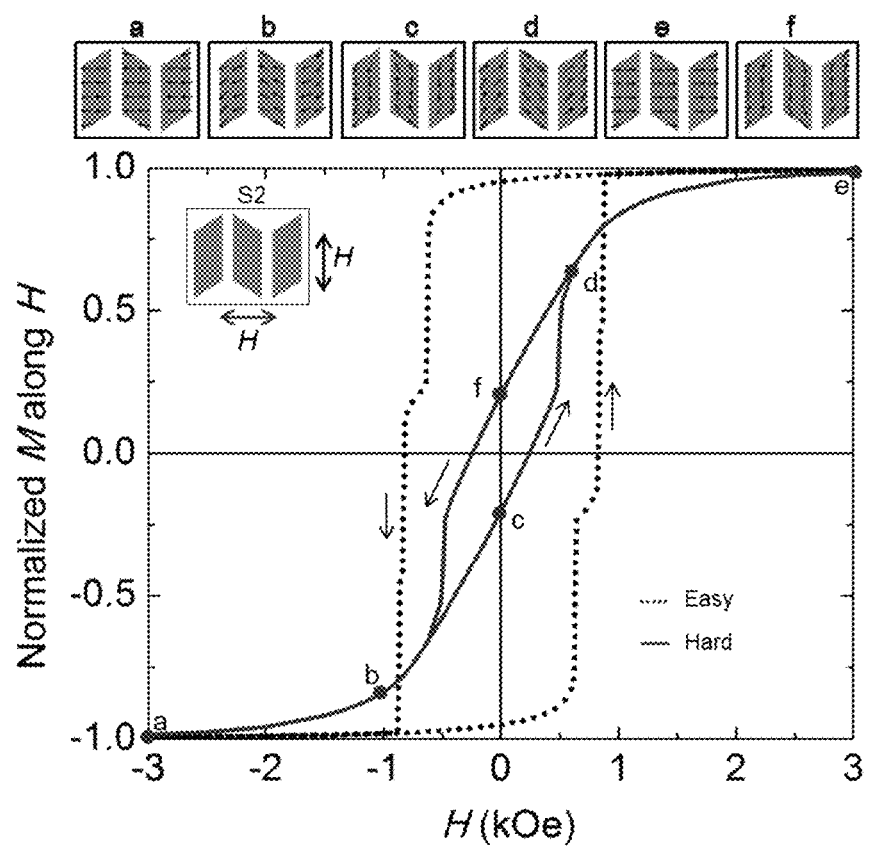
FIG. 6 shows simulated magnetic hysteresis loops for S2 with δ=50 nm, where a magnetic field is applied along x-axis (solid line) and y-axis (dotted line), and simulated spin configurations at field points, a-f, are shown at the top, in accordance with an embodiment of the invention.

In order to investigate the reversal process when the field is applied along the short axis (curve 600), a micromagnetic method is used and the results are shown in FIG. 6 for PQP (S2) network (δ=50 nm). Easy axis loop (curve 602) is shown for comparison. Magnetic configurations at different field locations are shown for the hard axis loop (curve 600) on the top of FIG. 6. At zero field, an AFM ground state (↓↑↓ or ↑↓↑) can be observed as also confirmed with the MFM measurements shown in FIG. 5C.

Figures 7A, 7B:
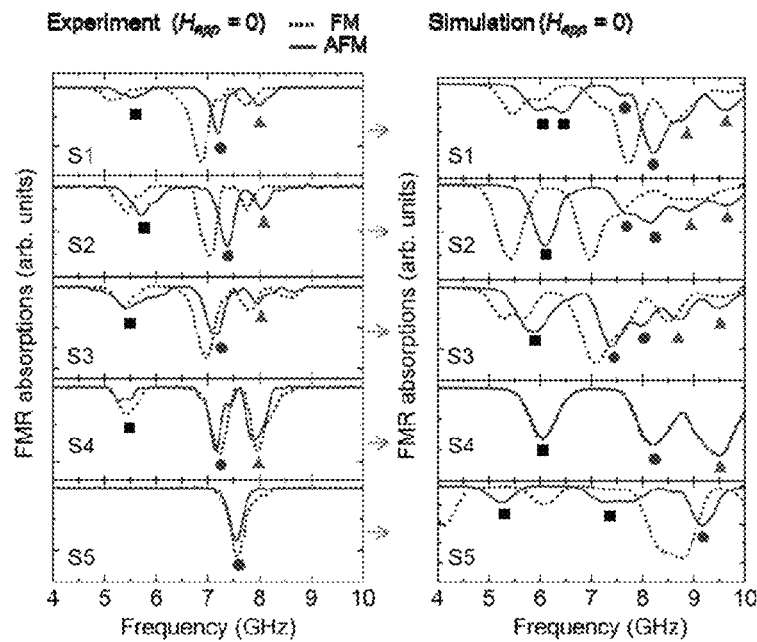
FIG. 7A shows comparative experimental FMR absorptions spectra at remanence ($H_{app}$=0) for designs, S1-S3 (δ=50 nm), S4 and S5 at AFM (solid line) and FM (dotted line) in accordance with embodiments of the invention.
FIG. 7B shows comparative simulated FMR absorptions spectra associated with FIG. 7A at remanence ($H_{app}$=0) for designs, S1-S3 (δ=50 nm), S4 and S5 at AFM (solid line) and FM (dotted line) in accordance with embodiments of the invention.

Next, the functionality of these networks in example embodiments based on magnetization dynamics is demonstrated using broadband FMR spectroscopy. In order to excite ferromagnetic resonant modes, coplanar waveguides are used. FMR responses of the arrays are measured using a microwave vector network analyzer (VNA) with the two ports connected to the CPW (compare Pt line 402 in FIG. 4A) using ground-signal ground (GSG) type microwave probes. Rows of FIG. 7A show the experimental FMR absorption spectra measured at zero field for all the samples (δ=50 nm for the networks) at AFM and FM ground states obtained with $H_i$: 2000 Oe→0 applied along the x-axis (solid lines) and the y-axis (dotted lines), respectively. The results of isolated PQ (S4) and R magnet (S5) arrays are also shown for comparison. Three prominent resonant modes are observed for all the samples made from P and Q magnets in FM/AFM ground states as denoted by black squares, red circles and blue triangles, marked only in the spectra for hard axis initializations (i.e. solid lines). A clear shift between the FM and the AFM spectra is observed in all the coupled networks. For instance in PQ (S1) network, the modes at 5.14 GHz, 6.87 GHz and 7.75 GHz in the FM state are shifted to 5.54 GHz, 7.19 GHz and 7.98 GHz, respectively. Positive shifts (Δf) of the modes can also be observed in the other two coupled networks (S2, S3), although the magnitude of the shift is different for different networks. In the case of isolated PQ array (S4), no shift between FM/AFM FMR spectra is found. In contrast to the three prominent modes for S1, S2, S3 and S4, a single mode at 7.56 GHz is observed in the reference R magnet array (S5) with no difference in the spectra for the two different field initializations.

Figure 7C:
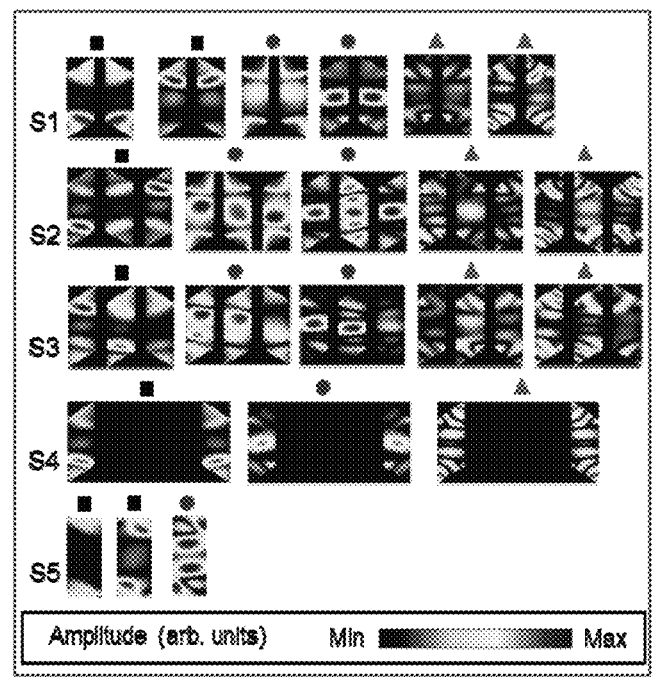
FIG. 7C depicts comparative simulated mode profiles for the prominent resonant peaks for designs, S1-S5. Colored arrows indicate the location of the different prominent resonant modes in accordance with embodiments of the invention.

To identify the observed modes, micromagnetic simulations are carried out using OOMMF and the results are shown in FIG. 7B. The five rows show the simulated FMR spectra for all the samples corresponding to the experimental results in FIG. 7A. All the major modes and the frequency shift between FM and AFM states are also observed in simulations for the coupled networks (S1, S2, S3, S4). The slight difference between experimental and simulated spectra of the R-magnet (S5) is due to the difference in their ground magnetic state which has multi-domain (compare simulation illustrated for R-magnet 104 in FIG. 7A) and mostly single domain in the experiment, compare FIG. 5F. In order to obtain further insights of the modes, plots of simulated spatial mode profiles are shown in FIG. 7C. Each row shows the spatial amplitude distributions of one sample for the modes denoted by corresponding symbols in FIG. 7B. Modes, denoted by squares, are found to be concentrated near the edges and those denoted by circles are located mainly at the center of the nanomagnets. From these surface profiles the former are identified as edge modes (EM) and the later as center modes (CM). The modes marked with triangles have nodal lines near the edges of the nanomagnets. Note that these three types of modes are observed at remanence.

For the analysis of the observed frequency shift, the center mode frequency ($f_{CM}$, denoted by circles in FIG. 7C) is used for comparing the frequency shift between the FM and AFM states in the coupled networks (S1, S2, S3). The frequency shift is defined as: $\Delta f_{CM} = f_{CM}(AFM) - f_{CM}(FM)$. The experimental values of $\Delta f_{CM}$ are 320 MHz, 345 MHz and 170 MHz for PQ (S1), PQP (S2) and PPQ (S3) networks, respectively. The variation of the frequency shift can be estimated using Kittel formula:

$$f_{res} = \frac{\gamma}{2\pi}\sqrt{(H_{eff} + (N_z - N_y)M_y)(H_{eff} + (N_x - N_y)M_y)}; \quad (1)$$

where $N_x$, $N_y$, and $N_z$, are the demagnetization factors along x-, y- and z-directions, respectively and these factors obey the relation: $N_x + N_y + N_z = 4\pi$. The variation in the effective fields inside the nanomagnets in different networks and with different initialization directions is pictorially depicted in FIG. 3C-3H described above for example embodiments. From our earlier discussions, $H_{eff} = H_{app} - H_{S-y}$ for the FM states of all the networks (S1, S2, S3) and $H_{eff} = H_{app} + H_{S-y}$ for the AFM states of PQ (S1) and PQP (S2) networks. To estimate Δf, the demagnetization factors are calculated for an isolated rectangular magnet, for simplification, with u=300 nm, w=130 nm and t=25 nm according to the formulations derived by Aharoni, see Aharoni, A., Demagnetizing factors for rectangular ferromagnetic prisms. *Journal of Applied Physics* 1998, 83 (6), 3432-3434. The calculated values are: $N_x=0.683\pi$, $N_y=0.286\pi$, and $N_z=3.031\pi$. Using these values in the Kittel formula (1), a frequency shift, $\Delta\delta=210$ MHz for 50 Oe field variation is obtained, the 50 Oe field variation being close to the average value of $H_{S-y}$ along the length of the nanomagnet for the stray field estimated from the L3 (curve 304) in FIG. 3B. It results in a frequency shift of $2\times\Delta f$ for the PQ (S1) and PQP (S2) networks (compare FIGS. 3C and F, and FIGS. 3D and G). On the other hand as the stray field effect is nullified in the AFM state of the PPQ (S3) network (compare FIGS. 3E and H), a frequency shift of $\Delta f$ should be expected. This can explain the variation of $\Delta f_{CM}$ in different networks as observed in FIG. 7A. With this argument no frequency shift is expected in the absence of stray field and this is confirmed in the spectra for the decoupled arrays (isolated PQ (S4) and R (S5)).

As magnetostatic interaction is found to play the key role in the dynamic responses, a systematic investigation of the effect of inter-element gap, $\delta$ has been investigated. FIG. 8A show the experimental FMR absorption spectra of the PQP (S2) network for $\delta=50$ nm, 75 nm and 100 nm. More specifically, FIG. 8A is a diagram showing variation of experimental FMR absorption spectra for design S2 with varying gap, $\delta$, in FM (top panel in FIG. 8A) and AFM (bottom panel in FIG. 8A) ground states in accordance with embodiments of the invention. FIG. 8C shows the variation of $\Delta f_{CM}=f_{CM}(AFM)-f_{CM}(FM)$ with the gap, $\delta$, for designs S1 (triangles), S2 (squares) and S3 (circles) in accordance with embodiments of the invention. From the FMR spectra in FIG. 8A, it can be seen that the modes in FM ground state are more sensitive to $\delta$ as compared to the modes in AFM ground state. This may be attributed to the opposite stray field configurations in FM and AFM states, as discussed earlier with respect to FIG. 3C-3H. The frequency shift decreases with increasing $\delta$ (see FIG. 8C) and the results indicate that $\Delta f$ can be tuned by varying $\delta$ which is promising for practical applications. FIGS. 8B and 8D show the simulation results corresponding to FIGS. 8A and 8C, respectively.

Figures 10A, 10B:
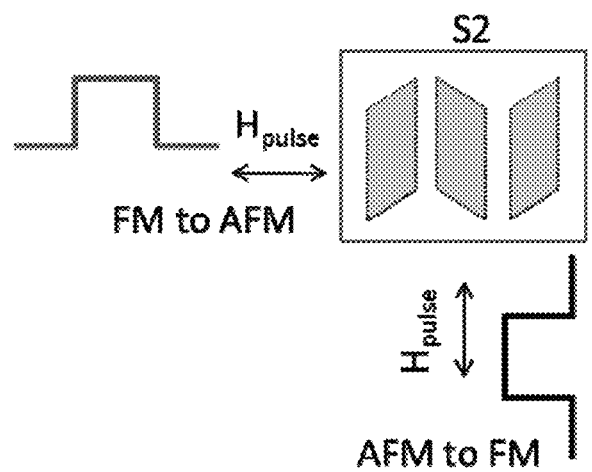
FIG. 10A shows a schematic diagram illustrating the pulse field ($H_{pulse}$) directions for obtaining FM/AFM ground states in simulations in accordance with an embodiment of the invention.
FIG. 10B shows a table of the switching field amplitude and duration for designs S1, S2 and S3 for two different dimensions in accordance with embodiments of the invention.

Next, an example embodiment for application in an XOR logic is described through distinct dynamic responses of the different ground magnetic states of the PQ (S1) network for $\delta=50$ nm, as shown in FIGS. 9A and 9B. The ground states of the two constituting RNMs (P and Q) are used as two logical inputs where ↓ and ↑ magnetizations are referred to as logic input 0 and 1, respectively. FM (↓↓(curve 901) and ↑↑ (curve 904)) and AFM (↓↑(curve 902) and ↑↓0 (curve 903)) ground states are obtained by applying H, along the long and short axis, respectively. FMR is used to monitor the output of the device. A prominent resonant mode is seen for the AFM state (curves 902, 903) at 7.2 GHz in the FMR absorption spectra in FIG. 9A and it is defined as the logical output 1. In the FM state (curves 901, 904), however, the resonant modes appear at a different frequency leading to no absorption at 7.2 GHz, thereby referring to logical output 0. The results obtained in the example embodiment represent a XOR logic operation as shown in FIG. 9B. From the additional simulations results shown in FIGS. 10A and 10B, switching between the FM and AFM states can be obtained using a sub-nanosecond field pulse which is promising for ultrafast operations in one embodiment. Monitoring magnetization dynamics as the output as proposed in the example embodiment may involve addressing technical issues such as, e.g., the readout process, on-chip reconfiguration of the inputs. In one embodiment, such XOR samples may be placed on top of a cross-point architecture for switching between different logic states using dc current pulse.

Figure 11A:
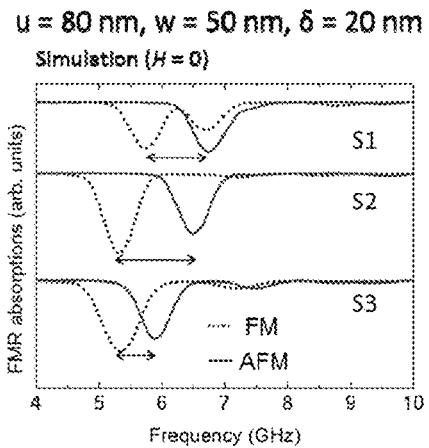
FIG. 11A shows the simulated absorption spectra for designs S1, S2, S3 (u×w×δ=80×50×20 nm$^3$) at FM and AFM ground states in accordance with embodiments of the invention.
Figure 11C:
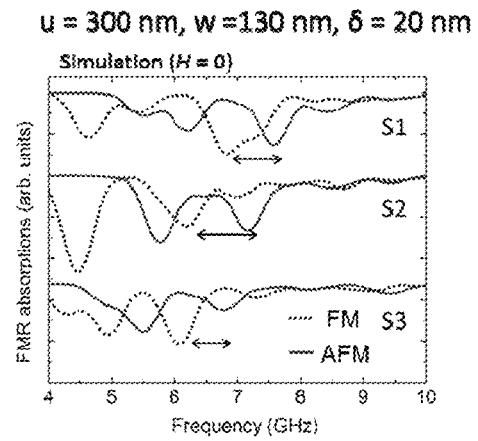
FIG. 11C shows the simulated absorption spectra for designs S1, S2, S3 (u×w×δ=300×130×20 nm$^3$) at FM and AFM ground states in accordance with embodiments of the invention.
Figure 11B:
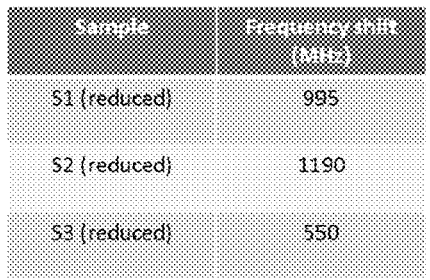
FIG. 11B shows a table of the frequency shifts of the prominent peak as marked in FIG. 11A in accordance with embodiments of the invention.
Figure 11D:
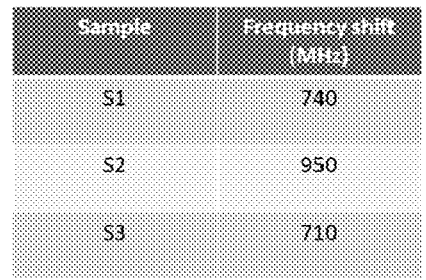
FIG. 11D shows a table of the frequency shifts of the prominent peak as marked in FIG. 11C in accordance with embodiments of the invention.
Figure 11E:
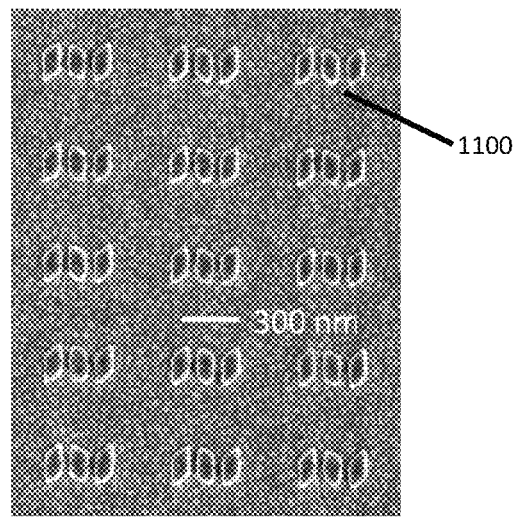
FIG. 11E shows the scanning electron microscopy (SEM) image of sample S2 with u×w×δ=150×90×40 nm$^3$ in accordance with an embodiment of the invention.

Controlled dynamic response may also be realized in various embodiments by scaling down the device structures. For demonstration, FIG. 11A shows the simulated absorption spectra for designs S1, S2, S3 ("reduced" dimensions, $u\times w\times\delta=80\times50\times20$ nm$^3$) at FM and AFM ground states in accordance with embodiments of the invention. FIG. 11B tabulates the frequency shifts of the prominent peak in the simulated absorption spectra in FIG. 11A. For comparison with the larger dimensions, FIG. 11C shows the simulated absorption spectra for designs S1, S2, S3 ($u\times w\times\delta=300\times130\times20$ nm$^3$) at FM and AFM ground states. FIG. 11D tabulates the frequency shifts of the prominent peak in the simulated absorption spectra in FIG. 11C. For experimental demonstration, an array of downscaled S2 sample e.g. 1100 was fabricated with $u\times w\times\delta=150\times90\times40$ nm$^3$, as shown in the SEM image in FIG. 11E. AFM ground state was stabilized in this array after initialized ($H_y$: 2000 Oe→0) along its geometrical short axis as shown in FIG. 11F (i.e. ↑↓↑ configuration of the samples e.g. 1102). FIG. 11G (top panel) shows the experimental FMR absorption spectra for FM and AFM ground state and the shift between the resonant modes, and the results are also compared with simulations (bottom panel). In the downscaled PQP (S2) network, two prominent modes can be observed and the value of $\Delta f$ is 600 MHz which is much larger than $\Delta f=345$ MHz obtained for the center mode in the "regular" PQP (S2) network (compare $\Delta f_{CM}$ for S2 (squares) in FIG. 8C, $\delta=50$ nm).

In order to further assess the effect of dimensions on the dynamics, simulations for varying the angle ($\theta$) of the slanted edge of the RNM are performed according to example embodiments. FIG. 12A shows the angle ($\theta$) of the slanted edges of designs S2 with dimensions $u\times w\times\delta=80\times50\times20$ nm$^3$ in accordance with an embodiment of the invention. AFM ground state is obtained for $\theta$ as small as 10° and a wide range of frequency tunability is found by varying $\theta$. FIG. 12B tabulates the frequency shifts for various angles, 0 associated with the sample in FIG. 12A. FIG. 12C shows a sample with the nanomagnets having only one side slanted, and having the dimensions of $u\times w\times\delta=80\times50\times20$ nm$^3$. FIG. 12D tabulates the frequency shifts for various angles, $\theta$, associated with the design in FIG. 12C. For the embodiment shown in FIG. 12C, the magnetic states are not deterministic at 10°, i.e. no deterministic AFM states were observed.

Figure 13A:
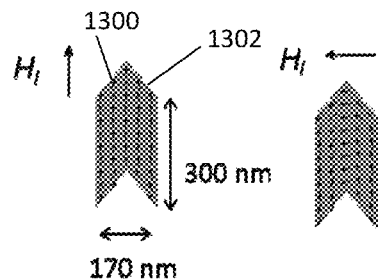
FIG. 13A shows a schematic drawing illustrating a design when two rhomboid nanomagnets are attached (δ=0), and the simulated spin distributions are also shown after initializing along geometrical long and short axes in accordance with an embodiment of the invention.
Figure 13B:
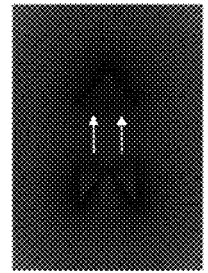
FIGS. 13B and 13C show the simulated demagnetization field distributions for the two magnetic configurations as shown in FIG. 13A in accordance with an embodiment of the invention.
Figure 13C:
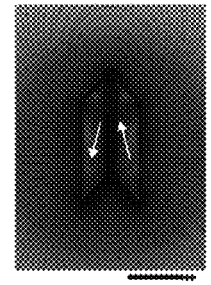
Figure 13D:
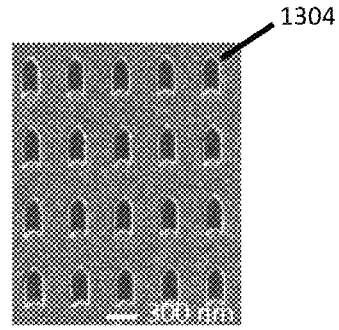
FIG. 13D shows the scanning electron microscopy image of the sample shown in FIG. 13A in accordance with an embodiment of the invention.
Figure 13E:
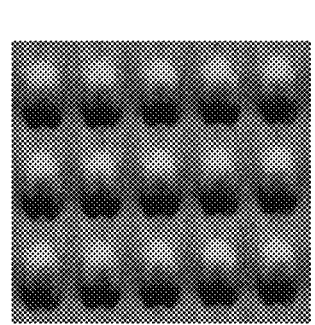
FIG. 13E shows the experimental MFM image when initialized along easy axis in accordance with an embodiment of the invention.
Figure 13F:
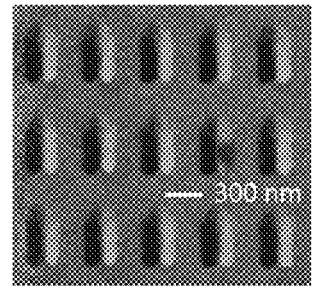
FIG. 13F shows the experimental MFM image when initialized along short axis in accordance with an embodiment of the invention.
Figure 13G:
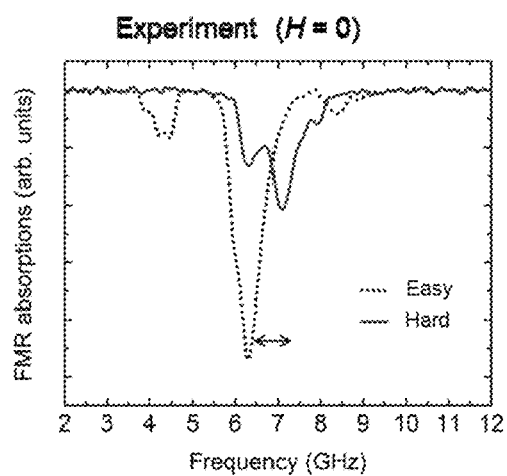
FIG. 13G shows the experimental FMR absorption spectra for the two magnetic configurations as shown in FIG. 13A in accordance with an embodiment of the invention.
Figure 13H:
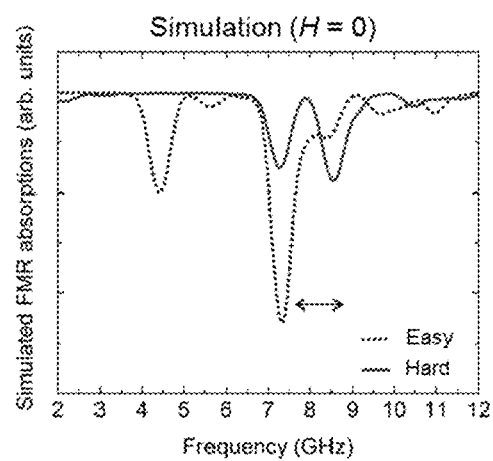
FIG. 13H shows the simulated FMR absorption spectra for the two magnetic configurations as shown in FIG. 13A in accordance with an embodiment of the invention.

FIG. 13A illustrates a design when two rhomboid nanomagnets 1300, 1302 are attached ($\delta=0$), and the simulated spin distributions are also shown after initializing along geometrical long (on left side in FIG. 13A) and short (on right side in FIG. 13A) axes in accordance with embodiments of the invention. FIGS. 13B and 13C show the simulated demagnetization field distributions for the two magnetic configurations as shown on the left and rights sides in FIG. 13A, respectively. FIG. 13D is the scanning electron microscopy image of and array of samples e.g. 1304 of the type shown in FIG. 13A. FIG. 13E shows the experimental MFM image when initialized along the long (easy) axis, and FIG. 13F shows the experimental MFM image when initialized along short (hard) axis. Remanent magnetic states in FIGS. 13E and 13F match well with the simulated spin distributions in FIGS. 13B and 13C, respectively. FIG. 13G shows the experimental FMR absorption spectra for the two magnetic configurations as shown on the left and right side in FIG. 13A, respectively. FIG. 13H shows the corresponding simulated FMR absorption spectra for the two magnetic configurations as shown on the left and right side in FIG. 13A.

Figure 14A:
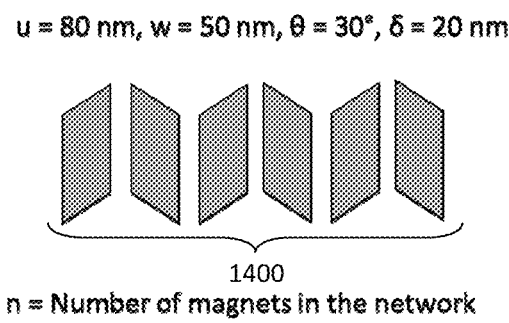
FIG. 14A shows a schematic drawings illustrating a network of varying number of nanomagnets (n=6, here) with $u \times w \times \delta = 80 \times 50 \times 20$ nm$^3$ in accordance with embodiments of the invention.
Figure 14B:
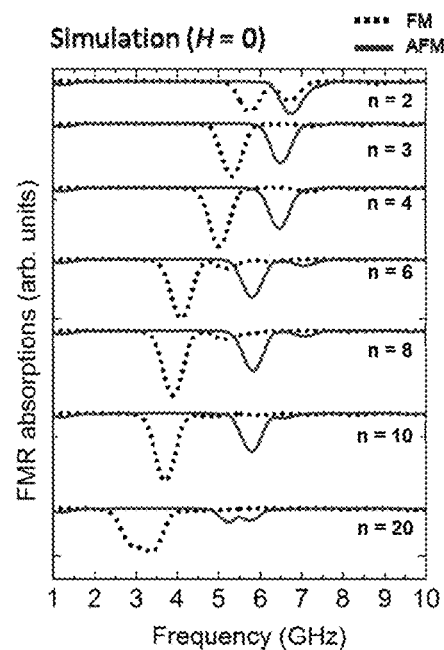
FIG. 14B show simulated FMR absorption spectra by varying the number of magnets (n) in the network at FM and AFM ground magnetic configurations in accordance with embodiments of the invention.
Figure 14C:
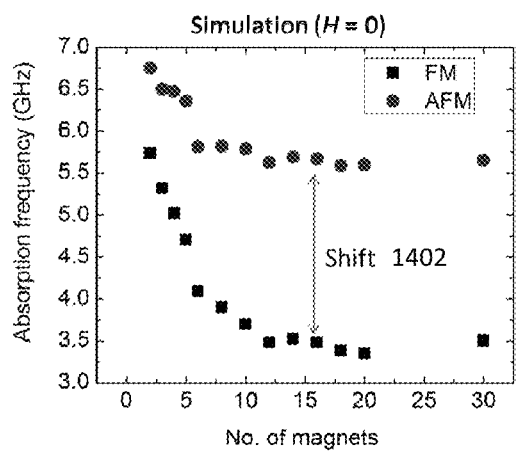
FIG. 14C shows a graph of resonant modes for FM and AFM states as a function of number of magnets (n) in the network in accordance with embodiments of the invention.
Figure 14D:
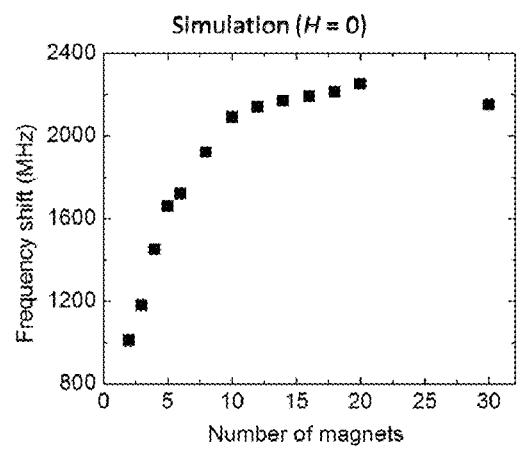
FIG. 14D shows a graph of the frequency shift between FM and AFM states as a function of number of magnets (n) in accordance with embodiments of the invention.

Larger frequency shift is desirable in example embodiments for unambiguous identification of the modes in device operation. As shown before, Δf increases with increasing stray field contribution between FM and AFM states. One possible way can be to increase the number of magnets (n) in the network. In order to assess the effect of the number of nanomagnets in a network on Δf, additional simulations are carried out in downsized nanomagnetic networks 1400 by varying n, see FIG. 14A. FIG. 14B-14D show the results of the assessment according to example embodiments. FIG. 14C is a graph showing resonant modes for FM (squares) and AFM (circles) states as function of number of magnets (n). The value of frequency shift 1402 increases with increasing 'n' and it is found to be saturated above n=15.

Similar analysis were carried out in networks 1500 with regular dimensions u×w×δ=300×130×50 nm³ according to example embodiments, as shown in FIG. 15A. The results of the simulation assessment are shown in FIG. 15B-C. FIG. 15B are simulated FMR absorption spectra with varying number of magnets (n) in the network 1500 at FM and AFM ground magnetic configurations. FIG. 15C tabulates the frequency shift with varying number of magnets (n) in the network.

Figure 15F:
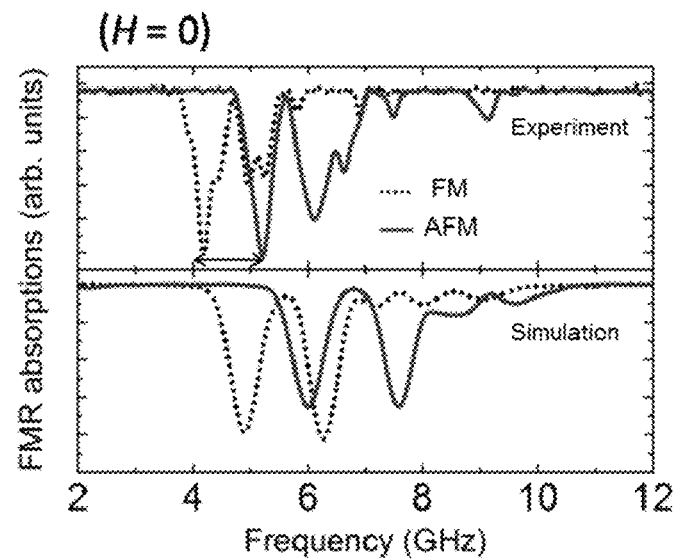
FIG. 15F shows the experimental FMR absorption spectra for the sample in FIG. 15D in FM and AFM magnetic ground state, and the results are also compared with simulations (bottom panel) in accordance with an embodiment of the invention.

For experimental demonstration, an array of networks e.g. 1502 of 10 RNMs was fabricated according to example embodiments. FIG. 15D shows the array of 10 coupled alternate P- (e.g. 1504) and Q- (e.g. 1506) magnets (u×w× δ=300×130×50 nm³ and δ=50 nm) making up each network e.g. 1502, and FIG. 15E shows the MFM image of the AFM ground state for the networks e.g. 1508 obtained after initialized ($H_I$: 2000 Oe→0) along their short axis. FIG. 15F shows the experimental (top panel) and simulated (bottom panel) FMR absorption spectra for the AFM and FM ground states which each show two major modes, and the frequency shifts (Δf) of 1000 MHz and 1200 MHz for the lower and higher frequency modes, respectively. These values are in good agreement with the simulated results which are 1100 MHz and 1300 MHz, respectively. It is believed that the larger frequency shift is the outcome of increment of the stray field due to more coupled neighbors.

According to example embodiments, an AFM lattice in-plane as well as in out-of-plane direction can be created with nanomagnets such the, but not limited to, the RNMs. This may open up new opportunities for reconfigurable 2D and 3D microwave magnetic materials. It should be noted here that the results are shown for permalloy (Py) in example embodiments described herein. However, the present invention is not limited to those example embodiments, but can be applicable to other magnetic materials such as, by way of example and not limitation, iron (Fe), cobalt (Co), nickel (Ni), CoFeB, Heuslar alloys, ferromagnetic metals, ferromagnetic alloys, and the like. As the resonant spectra depend largely on the saturation magnetization of the magnetic materials in various embodiments, different range of GHz frequency band can advantageously be obtained for operation which is of great importance in practical applications. For instance, dynamic response of a single isolated RNM made from Py according to an example embodiment appears around 8-10 GHz in zero field and this value is almost double for Fe according to another example embodiment.

Figure 16:
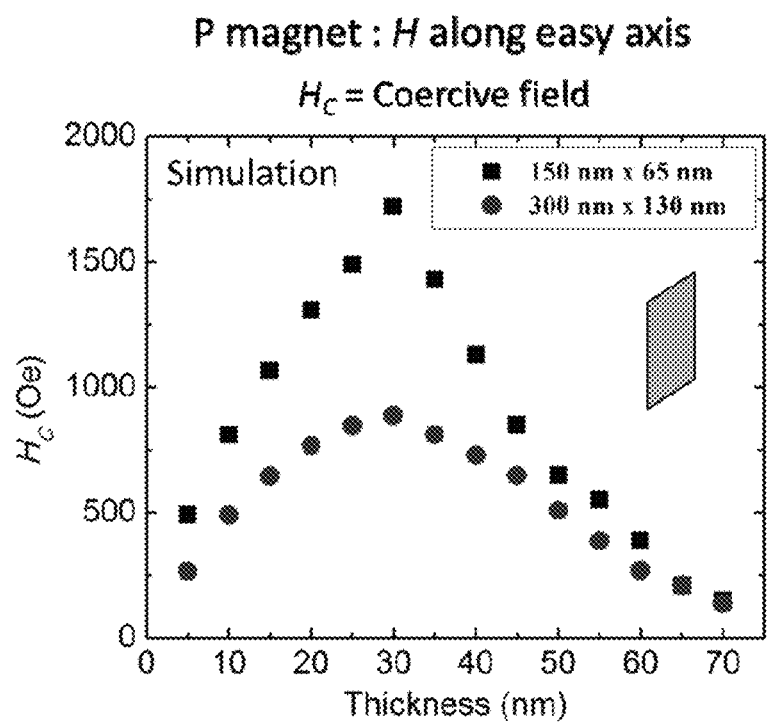
FIG. 16 shows a graph illustrating the thickness dependence of the coercive field in a P-magnet when the field is applied along easy axis for two different dimensions ($u \times w = 150$ nm$\times$65 nm and 300 nm$\times$130 nm) in accordance with embodiments of the invention.

Another important parameter for optimization of performance and exploring new possibilities is the thickness of the nanomagnets, e.g. the RNMs. Simulation results provided in FIG. 16 show the variation of coercive fields (long or easy axis), $H_c$ as a function of thickness for a single P-magnet of two different sizes. $H_c$ is found to have a maximum at 30 nm thickness for both dimensions. Correct magnetic orientation, i.e. the expected remanent states in the RNMs upon field initialization as shown in FIG. 1, is found for thickness as high as 60 nm when initialized along the short or hard axis. Thickness dependent results indicate that it is possible to use such magnets in spin valve architecture by appropriately choosing the thickness for lower and higher coercive field values. As will be appreciated by a person skilled in the art, a typical spin valve consists of a magnetic fixed layer and a magnetic free layer separated by a thin nonmagnetic layer. In such devices both the layers may point in the same direction (parallel) or they can point in the opposite direction to each other (anti-parallel). The flow of spin polarized current through such a device gets highly attenuated in the anti-parallel case as compared with the parallel case, thus providing a platform for "0" and "1" operation. For demonstration, P-magnets are investigated with two magnetic layers separated by a non-magnetic spacer layer using micromagnetic simulations, as will be described below.

FIG. 17A shows a schematic side view of a multilayer structure of a nanomagnet 1700 showing a spacer layer 1702 between magnetic layer 1 (1704) and magnetic layer 2 (1706) in accordance with an embodiment of the invention. The thickness (10 nm in the example embodiments) of the spacer layer 1702 between the two ferromagnetic layers 11704 1706 is selected to preferably be large enough to ignore exchange interactions and small enough to consider strong dipolar coupling. FIG. 17B shows the top view of the nanomagnet 1700 in P-magnet configuration. In the following results the spacer layer 1702 was chosen to be 10 nm as mentioned above, which is larger than the exchange length in the materials under investigation such as, but not limited to, Py, Co and Fe. In the simulations the spacer layer 1702 is assumed to be air whereas, the spacer layer 1702 can be any nonmagnetic material in a practical device according to various embodiments. Magnetic material of the bottom layer 1704 was varied and the top layer 1706 was kept fixed as Py in the embodiments discussed below. The thicknesses of the bottom and top layers 1704, 1706 were 30 nm and 20 nm, respectively. The bottom layer 1704 thickness was chosen by the largest coercive field which was found at 30 nm thickness, compare FIG. 16. The lateral dimension of the P-magnet 1700 was 150 nm×65 nm.

FIGS. 18A and 18B show schematic views of the side and top views, respectively, of a multilayer RNM 1800 with Permalloy (Py) 1802/Spacer layer 1804/Permalloy (Py) 1806 multilayers showing a 10 nm spacer layer 1804 formed between a 30 nm layer 1802 of magnetic material of Permalloy (Py) and a 20 nm layer 1806 of magnetic material of Permalloy (Py) in accordance with an embodiment of the invention. In FIG. 18B, 150 nm×65 nm sides of the RNM 1800 are shown from the top view. FIGS. 18C and 18D show the hysteresis loops (easy and hard axes) and the FMR spectra, respectively, of the multilayer RNM 1800 of FIG. 18A in accordance with an embodiment of the invention. The arrows represent the magnetic orientations for different field history/initialization. An anti-parallel arrangement 1807 is possible because of the different switching field for different thickness. For geometrically identical elements, the switching field will be determined by the thickness of the layer. Here thickness plays the important role. Parallel and anti-parallel remanent states are achieved in example embodiments by choosing higher and lower thicknesses for the two magnetic layers 1802, 1806, respectively. The hysteresis loops and FMR spectra were obtained from micromagnetic simulations. At remanence, FM and AFM states were obtained when the field was applied along easy and hard axes, respectively. It will be appreciated that a pronounced shift 1808 between FM and AFM FMR spectra of 2.9 GHz is found, as indicated in FIG. 18D. This large shift 1808 is believed to be due to the presence of strong dipolar coupling for the 10 nm spacer layer 1804 between the magnetic layers 1802, 1806.

Figure 19A:
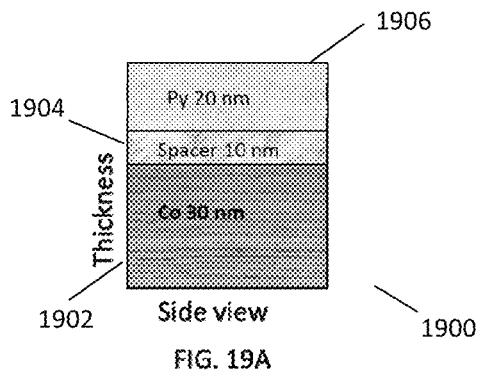
FIG. 19A shows a schematic drawing illustrating a multilayer rhomboid nanomagnet with Cobalt (Co)/Permalloy (Py) multilayers physically separated by a spacer layer in accordance with an embodiment of the invention.
Figure 19B:
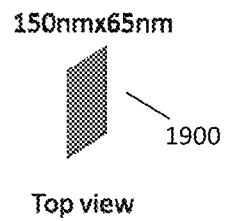
FIG. 19B shows a schematic top plan view of the multilayer rhomboid nanomagnet of FIG. 22 in accordance with an embodiment of the invention.
Figure 19C:
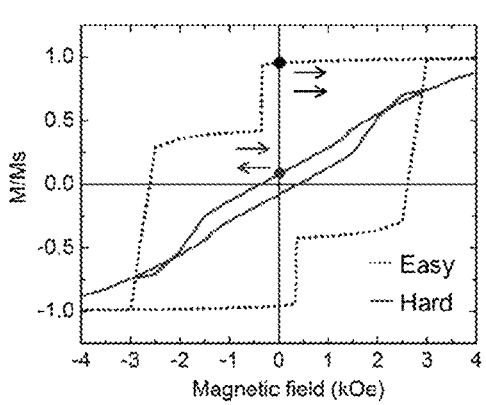
FIG. 19C shows the hysteresis loops along easy and hard directions of the multilayer rhomboid nanomagnet of FIG. 22 in accordance with an embodiment of the invention.
Figure 19D:
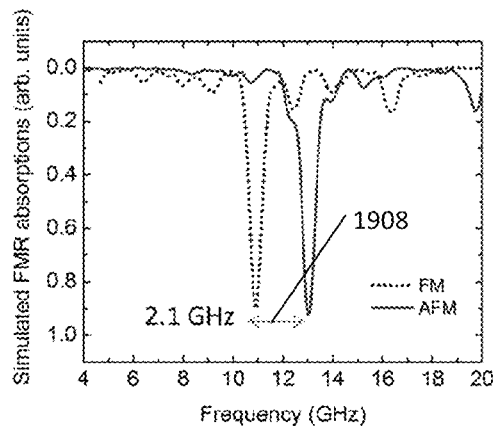
FIG. 19D shows the FMR spectra graph for FM and AFM configurations of the multilayer rhomboid nanomagnet of FIG. 22 in accordance with an embodiment of the invention.

FIGS. 19A and 19B show schematic views of the side and top views, respectively, of a multilayer RNM 1900 with Cobalt (Co) 1902/Spacer layer 1904/Permalloy (Py) 1906 multilayers showing a 10 nm spacer layer 1904 formed between a 30 nm layer 1902 of magnetic material of Cobalt (Co) and a 20 nm layer 1906 of magnetic material of Permalloy (Py) in accordance with an embodiment of the invention. In FIG. 19B, 150 nm×65 nm sides of the RNM 1900 are shown from the top view. FIGS. 19C and 19D show the hysteresis loops (easy and hard axes) and FMR spectra, respectively, of the multilayer RNM 1900 of FIG. 19A in accordance with an embodiment of the invention. It will be appreciated that a pronounced shift 1908 between FM and AFM FMR spectra is found, here 2.1 GHz, as indicated in FIG. 19D.

Figure 20A:
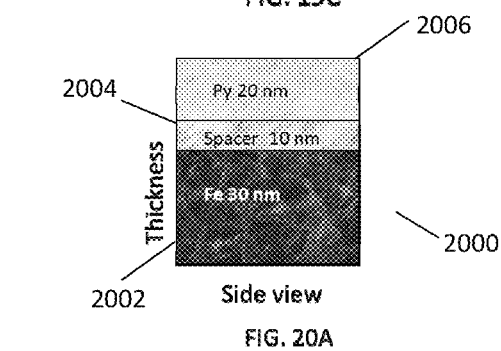
FIG. 20A shows a schematic drawing illustrating a multilayer rhomboid nanomagnet with Iron (Fe)/Permalloy (Py) multilayers physically separated by a spacer layer in accordance with an embodiment of the invention.
Figure 20B:
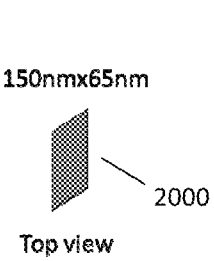
FIG. 20B shows a schematic top plan view of the multilayer rhomboid nanomagnet of FIG. 26 in accordance with an embodiment of the invention.
Figure 20C:
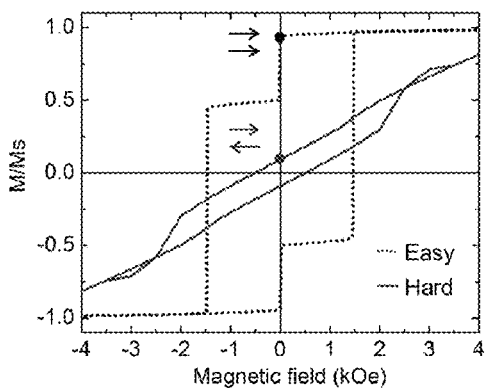
FIG. 20C shows the hysteresis loops along easy and hard directions of the multilayer rhomboid nanomagnet of FIG. 26 in accordance with an embodiment of the invention.
Figure 20D:
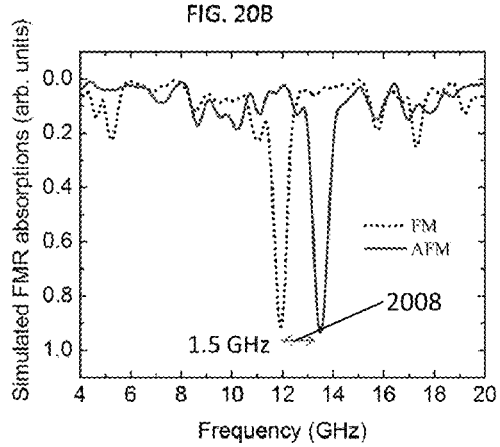
FIG. 20D shows the FMR spectra graph for FM and AFM configurations of the multilayer rhomboid nanomagnet of FIG. 26 in accordance with an embodiment of the invention.

FIGS. 20A and 20B show schematic views of the side and top views, respectively, of a multilayer RNM 2000 with Iron (Fe) 2002/Spacer layer 2004/Permalloy (Py) 2006 multilayers showing a 10 nm spacer layer 2004 formed between a 30 nm layer 2002 of magnetic material of Iron (Fe) and 20 nm layer 2006 of magnetic material of Permalloy (Py) in accordance with an embodiment of the invention. In FIG. 20B, 150 nm×65 nm sides of the RNM 2000 are shown from the top view. FIGS. 20C and 20D show the hysteresis loops (easy and hard axes) and FMR spectra, respectively, of the multilayer RNM 2000 of FIG. 20A in accordance with an embodiment of the invention. It will be appreciated that a pronounced shift 2008 between FM and AFM FMR spectra is found, here 1.5 GHz as indicated in FIG. 20D.

In an example embodiment, a nanomagnetic structure comprises two or more nanomagnetic material elements, each nanomagnetic material element having a respective predetermined geometric shape such that the nanomagnetic structure exhibits different stable ground states initializable by magnetic fields applied across the nanomagnetic structure in respective different directions; wherein the nanomagnetic material elements are disposed relative to each other such that the magnetic structure exhibits a difference in effective internal magnetic field strength between the different stable ground states.

The nanomagnetic material elements may be disposed relative to each other such as to enable coupling of an internal field of each of the nanomagnetic material elements to stray fields of one or more other ones of the nanomagnetic material elements.

Each predetermined geometric shape may comprise one of a group consisting of a rhomboid, parallelogram, trapezoid, kite, and quadrilateral.

The different directions may comprise parallel to short axes of the respective predetermined geometric shapes and parallel to long axes, relative to the short axes, of the respective predetermined geometric shapes.

At least one of the angles defining each of the predetermined geometric shapes may be within a range of 10-50°.

The stable ground states may comprise a reconfigurable ferromagnetic (FM) ground state and a reconfigurable antiferromagnetic (AFM) ground state.

The nanomagnetic material elements may be arranged proximate each other in an in-plane arrangement, in an out-of-plane arrangement, or both, relative to a plane parallel to the different directions.

The nanomagnetic material elements may comprise one or more of a group of consisting of permalloy (Py), iron (Fe), cobalt (Co), nickel (Ni), CoFeB, a Heuslar alloy, a ferromagnetic metal, and a ferromagnetic alloy.

The nanomagnetic structure may be configured for a nanomagnetic logic gate. The logic gate may be an XOR logic gate.

One or more of a group consisting of a size of the respective nanomagnetic material elements, a number of the nanomagnetic material elements, a spacing between the nanomagnetic elements, and a thickness of the respective nanomagnetic material elements may be chosen such that the difference in magnetic field strengths between the different stable ground states has a desired value.

Figure 21:
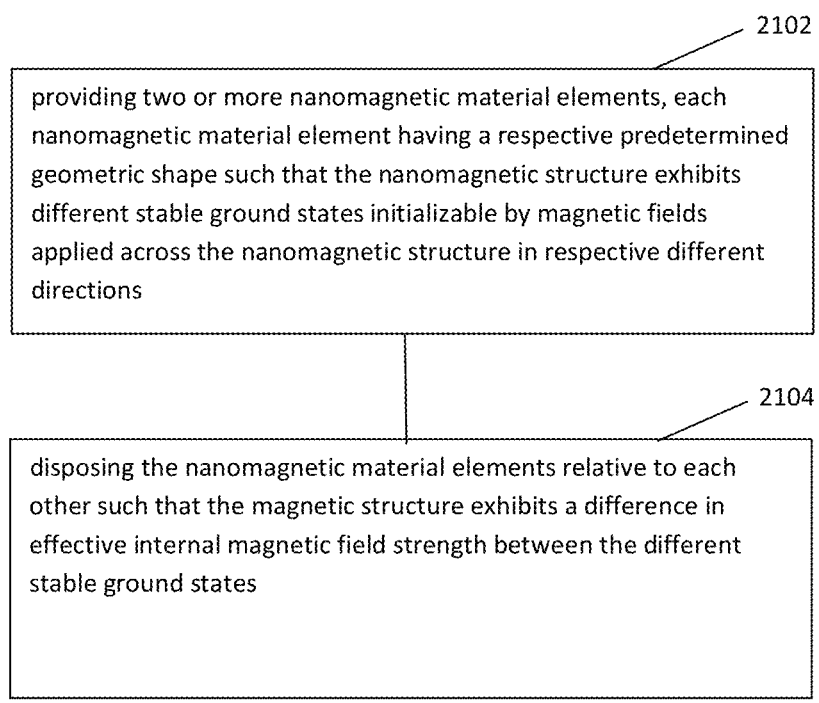
FIG. 21 shows a flowchart illustrating a method of fabricating a nanomagnetic structure, according to an example embodiment.

In one embodiment, a method of reconfigurable operation based on magnetization dynamic responses of a nanomagnetic structure or network for realizing a functionality of the nanomagnetic structure or network is provided, the method comprising determining distinct dynamic spectra associated with different magnetic ground states due to an engineered internal magnetic field strength variation specific to the nanomagnetic structure or network FIG. 21 shows a flowchart 2100 illustrating a method of fabricating a nanomagnetic structure, according to an example embodiment. The method comprises, at step 2102, providing two or more nanomagnetic material elements, each nanomagnetic material element having a respective predetermined geometric shape such that the nanomagnetic structure exhibits different stable ground states initializable by magnetic fields applied across the nanomagnetic structure in respective different directions. At step 2104, the nanomagnetic material elements are disposed relative to each other such that the magnetic structure exhibits a difference in effective internal magnetic field strength between the different stable ground states.

The method may comprise disposing the nanomagnetic material elements relative to each other such as to enable coupling of an internal field of each of the nanomagnetic material elements to stray fields of one or more other ones of the nanomagnetic material elements.

Each predetermined geometric shape may comprise one of a group consisting of a rhomboid, parallelogram, trapezoid, kite, and quadrilateral.

The different directions may comprise parallel to short axes of the respective predetermined geometric shapes and parallel to long axes, relative to the short axes, of the respective predetermined geometric shapes.

At least one of the angles defining each of the predetermined geometric shapes may be within a range of 10-50°.

The stable ground states may comprise a reconfigurable ferromagnetic (FM) ground state and a reconfigurable antiferromagnetic (AFM) ground state.

The method may comprise arranging the nanomagnetic material elements proximate each other in an in-plane arrangement, in an out-of-plane arrangement, or both, relative to a plane parallel to the different directions.

The nanomagnetic material elements may comprise one or more of a group of consisting of permalloy (Py), iron (Fe), cobalt (Co), nickel (Ni), CoFeB, a Heuslar alloy, a ferromagnetic metal, and a ferromagnetic alloy.

The method may comprise configuring the nanomagnetic structure for a nanomagnetic logic gate. The logic gate may comprise an XOR logic gate.

The method may comprise selecting one or more of a group consisting of a size of the respective nanomagnetic material elements, a number of the nanomagnetic material elements, a spacing between the nanomagnetic elements, and a thickness of the respective nanomagnetic material elements are chosen such that the difference in magnetic field strengths between the different stable ground states has a desired value.

According to example embodiments described herein, control of magnetization dynamics in bistable nanomagnetic networks and operations may be based on magnetization dynamics. Distinct dynamic responses are obtained from reconfigurable FM and AFM ground states of the networks. Instead of magnetic coupling induced anisotropy, shape induced magnetic anisotropy is utilized in example embodiments, for example from RNMs, to achieve deterministic magnetic ground states. This mechanism is advantageously less sensitive to uncontrollable fabrication defects and uniform results in large area arrays are shown. The control of dynamic responses can be achieved by manipulating the amplitude/direction of the magnetostatic interactions and flexibility of tuning the dynamics has been emphasized by selectively placing the RNMs in a coupled network. Experimental results are validated using micromagnetic simulations and numerical analysis. Further improvement of the operation of such devices is obtained by down scaling the dimensions and increasing the number of nanomagnets in a network, according to example embodiments. Operation of XOR logic gate is experimentally demonstrated based on distinct dynamics of FM and AFM ground state according to example embodiments. Ultrafast (sub-ns) switching of the different ground states are estimated using micromagnetic simulations.

The deterministic control over magnetic ground states and probing magnetization dynamics as an output according to example embodiments such as, but not limited to the XOR logic gate described herein, advantageously adds extra functionalities in nanomagnetic network based spintronic devices. As shown here, the ground state of an RNM in example embodiments is advantageously not affected by its coupled neighbor(s) which can be an important attribute also for biasing operations and as fixed layer in spin-valve devices. Example embodiments can also provide an advantage for obtaining a deterministic ground state in large area complex networks. Tunabilities of ground magnetic state as well as its dynamics in, for example, RNM networks are appealing for programmable logic and storage with larger integration density and low power operation. Magnetization dynamics manipulation by precisely controlling various ground magnetic states facilitates development of nanomagnetic network based information processing according to various embodiments.

In example embodiments investigated herein, oxidized Si substrates are spin coated with PFI positive photoresist followed by optical lithography for patterning 20 μm wide coplanar waveguides (CPWs) with ground-signal-ground (GSG) lines. After developing in AZ 300 MIF solution, a thin film stack of Cr (5 nm) and Pt (200 nm) are deposited using thermal evaporation and sputtering technique, respectively. The bottom Cr layer is used for seeding. The CPWs are obtained by metal lift-off with acetone and ultrasonic agitation. Then the substrate is spin coated with positive resist PMMA (polymethyl methacrylate) for patterning the nanomagnets on top of the CPWs using high resolution electron beam lithography technique followed by developing in MIBK (methyl isobutyl ketone) and IPA (isopropyl alcohol) solution with MIBK:IPA=1:3. Electron beam evaporation of a bilayer of Cr(5 nm)/Ni$_{80}$Fe$_{20}$(25 nm) is carried out at $4.5\times10^{-8}$ Torr base pressure and at 0.2 Å/s deposition rate. Magnetic nanostructures with sharp edges and gaps are obtained after metal lift-off with acetone and ultrasonic agitation. Arrays of more than 3000 networks are fabricated on the CPWs to detect the dynamic response reliably in example embodiments. It will be appreciated that fabrication of structures and devices according to example embodiments of the present invention is not limited to the process described above, and other processes understood be a person skilled in the art can be used in various embodiments.

In order to visualize the magnetization reversal mechanism according to example embodiments, micromagnetic simulations are carried out by solving Landau Lifshitz Gilbert equation using three dimensional 'Object Oriented Micromagnetic Framework' (OOMMF) software. Typical parameters for Permalloy are used: saturation magnetization, $M_s$=800 emu/cm$^3$, exchange constant, $A_{ex}$=13×10$^{-7}$ erg/cm, magnetocrystalline anisotropy, $K_1$=0. For simulations the samples are divided into three dimensional arrays of cells of dimensions 5×5×5 nm$^3$. The cell size is smaller than the exchange length ($l_{ex}$=5.7 nm) which is defined as $l_{ex}=\sqrt{(A/2\pi M_s^2)}$. For dynamic simulations, a damping constant $\alpha$=0.008 is used and the data are plotted in the frequency domain by performing Fourier transforms. A larger $\alpha$=0.5 is used in quasi-static simulations for rapid convergence. The mask used for the simulations are derived from the scanning electron micrographs.

Embodiments of the nanomagnetic structures and devices as described herein may be used in spin valve type architectures. The application of embodiments may be implemented in reconfigurable microwave materials. The resonant frequency may be tuned for the same structures by changing the ferromagnetic materials or material thickness. This means that multi-resonant frequencies can be achieved. A network of such shape induced anisotropy nanomagnets (rhomboid shown in illustrative examples here, not by way of limitation) may be designed and implemented to manipulate its resonant dynamics. Complex magnetic ground states may be achieved, which are elusive in dipolar coupling driven architecture.

Embodiments of the invention have been described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by the applicable law. Moreover, any combination of the above-described elements in all possible variations thereof is encompassed by the invention unless otherwise indicated herein or otherwise clearly contradicted by context.

What is claimed is:

1. A nanomagnetic structure comprising:
   two or more nanomagnetic material elements, each nanomagnetic material element having a respective predetermined geometric shape such that the nanomagnetic structure exhibits different stable ground states initializable by magnetic fields applied across the nanomagnetic structure in respective different directions;
   wherein the nanomagnetic material elements are disposed relative to each other such that the magnetic structure exhibits a difference in effective internal magnetic field strength between the different stable ground states.

2. The nanomagnetic structure of claim 1, wherein the nanomagnetic material elements are disposed relative to each other such as to enable coupling of an internal field of each of the nanomagnetic material elements to stray fields of one or more other ones of the nanomagnetic material elements.

3. The nanomagnetic structure of claim 1 wherein each predetermined geometric shape comprises one of a group consisting of a rhomboid, parallelogram, trapezoid, kite, and quadrilateral.

4. The nanomagnetic structure of claim 1 wherein the different directions comprise parallel to short axes of the respective predetermined geometric shapes and parallel to long axes, relative to the short axes, of the respective predetermined geometric shapes.

5. The nanomagnetic structure of claim 1 wherein at least one of the angle defining each of the predetermined geometric shapes is within a range of 10-50°.

6. The nanomagnetic structure of claim 1 wherein the stable ground states comprise a reconfigurable ferromagnetic (FM) ground state and a reconfigurable antiferromagnetic (AFM) ground state.

7. The nanomagnetic structure of claim 1 wherein the nanomagnetic material elements are arranged proximate each other in an in-plane arrangement, in an out-of-plane arrangement, or both, relative to a plane parallel to the different directions.

8. The nanomagnetic structure of claim 1 wherein the nanomagnetic material elements comprise one or more of a group of consisting of permalloy (Py), iron (Fe), cobalt (Co), nickel (Ni), CoFeB, a Heuslar alloy, a ferromagnetic metal, and a ferromagnetic alloy.

9. The nanomagnetic structure of claim 1 wherein the nanomagnetic structure is configured for a nanomagnetic logic gate.

10. The nanomagnetic structure of claim 9 wherein the logic gate is an XOR logic gate.

11. The nanomagnetic structure of claim 1 wherein one or more of a group consisting of a size of the respective nanomagnetic material elements, a number of the nanomagnetic material elements, a spacing between the nanomagnetic elements, and a thickness of the respective nanomagnetic material elements are chosen such that the difference in magnetic field strengths between the different stable ground states has a desired value.

12. A method of fabricating a nanomagnetic structure, the method comprising:
providing two or more nanomagnetic material elements, each nanomagnetic material element having a respective predetermined geometric shape such that the nanomagnetic structure exhibits different stable ground states initializable by magnetic fields applied across the nanomagnetic structure in respective different directions; and
disposing the nanomagnetic material elements relative to each other such that the magnetic structure exhibits a difference in effective internal magnetic field strength between the different stable ground states.

13. The method of claim 12, comprising disposing the nanomagnetic material elements relative to each other such as to enable coupling of an internal field of each of the nanomagnetic material elements to stray fields of one or more other ones of the nanomagnetic material elements.

14. The method of claim 12 wherein each predetermined geometric shape comprises one of a group consisting of a rhomboid, parallelogram, trapezoid, kite, and quadrilateral.

15. The method of claim 12 wherein the different directions comprise parallel to short axes of the respective predetermined geometric shapes and parallel to long axes, relative to the short axes, of the respective predetermined geometric shapes.

16. The method of claim 12 wherein at least one of the angle defining each of the predetermined geometric shapes is within a range of 10-50°.

17. The method of claim 12 wherein the stable ground states comprise a reconfigurable ferromagnetic (FM) ground state and a reconfigurable antiferromagnetic (AFM) ground state.

18. The method of claim 12 comprising arranging the nanomagnetic material elements proximate each other in an in-plane arrangement, in an out-of-plane arrangement, or both, relative to a plane parallel to the different directions.

19. The method of claim 12 wherein the nanomagnetic material elements comprise one or more of a group of consisting of permalloy (Py), iron (Fe), cobalt (Co), nickel (Ni), CoFeB, a Heuslar alloy, a ferromagnetic metal, and a ferromagnetic alloy.

20. The method of claim 12 comprising configuring the nanomagnetic structure for a nanomagnetic logic gate.

21. The method of claim 20 wherein the logic gate comprises an XOR logic gate.

22. The method of claim 12 comprising selecting one or more of a group consisting of a size of the respective nanomagnetic material elements, a number of the nanomagnetic material elements, a spacing between the nanomagnetic elements, and a thickness of the respective nanomagnetic material elements are chosen such that the difference in magnetic field strengths between the different stable ground states has a desired value.

* * * * *